United States Patent
Kodama

(10) Patent No.: US 8,827,400 B2
(45) Date of Patent: Sep. 9, 2014

(54) LIQUID APPLICATION APPARATUS, LIQUID APPLICATION METHOD AND IMPRINTING SYSTEM

(75) Inventor: Kenichi Kodama, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 50 days.

(21) Appl. No.: 13/635,250

(22) PCT Filed: Mar. 15, 2011

(86) PCT No.: PCT/JP2011/056683
§ 371 (c)(1),
(2), (4) Date: Sep. 14, 2012

(87) PCT Pub. No.: WO2011/115282
PCT Pub. Date: Sep. 22, 2011

(65) Prior Publication Data
US 2013/0010020 A1    Jan. 10, 2013

(30) Foreign Application Priority Data
Mar. 17, 2010  (JP) .................................. 2010-060919

(51) Int. Cl.
| | |
|---|---|
| *B41J 29/38* | (2006.01) |
| *B82Y 10/00* | (2011.01) |
| *B82Y 40/00* | (2011.01) |
| *G03F 7/00* | (2006.01) |
| *B41M 7/00* | (2006.01) |

(52) U.S. Cl.
CPC ............... *G03F 7/0002* (2013.01); *B82Y 10/00* (2013.01); *B82Y 40/00* (2013.01); *B41M 7/0081* (2013.01)
USPC ......................................................... 347/10

(58) Field of Classification Search
CPC ............... B41J 2/04581; B41J 2/04588; B41J 2/04541; B41J 2/04593; B41J 2/0458; B41J 2202/20; B41J 2/04543; B41J 2/155; B41J 29/393; B41J 2/17546; B41J 2/0451; B41J 2/2135; B41J 2/1623; B41J 2/1631; B41J 2/1628; B41J 2/14024; B41J 2/1603

USPC ................................ 347/5–20, 102, 107, 109
See application file for complete search history.

(56) References Cited

U.S. PATENT DOCUMENTS
2005/0090029 A1    4/2005    Yamazaki et al.
(Continued)

FOREIGN PATENT DOCUMENTS
JP    2007-273979 A    10/2007
(Continued)

OTHER PUBLICATIONS

Form PCT/IB/326, Form PCT/IB/373 and Form PCT/ISA/237 mailed Sep. 27, 2012, for International Application No. PCT/JP2011/056683.

(Continued)

*Primary Examiner* — Manish S Shah
*Assistant Examiner* — Roger W Pisha, II
(74) *Attorney, Agent, or Firm* — Birch, Stewart, Kolasch & Birch, LLP

(57) ABSTRACT

A liquid application apparatus includes: a head including a plurality of nozzles which eject droplets of liquid having functional properties toward a substrate; a relative movement device which causes the head and the substrate to move relatively to each other in a relative movement direction; a droplet ejection control device which operates the head at a prescribed droplet ejection period so as to deposit the droplets discretely onto the substrate; an x-direction droplet deposition pitch changing device which changes a deposition pitch of the droplets on the substrate in an x direction perpendicular to the relative movement direction; and a y-direction droplet deposition pitch changing device which changes a deposition pitch of the droplets on the substrate in a y direction parallel to the relative movement direction.

9 Claims, 16 Drawing Sheets

(56) References Cited

U.S. PATENT DOCUMENTS

| | | | |
|---|---|---|---|
| 2006/0268047 A1* | 11/2006 | Ota | 347/20 |
| 2007/0237886 A1 | 10/2007 | Dijksman et al. | |
| 2008/0062223 A1* | 3/2008 | Enomoto et al. | 347/40 |
| 2011/0066273 A1 | 3/2011 | Yoneda et al. | |

FOREIGN PATENT DOCUMENTS

| | | |
|---|---|---|
| JP | 2009-88376 A | 4/2009 |
| WO | WO 2004/070823 A1 | 8/2004 |
| WO | WO 2005/120834 A2 | 12/2005 |

OTHER PUBLICATIONS

International Search Report issued in PCT/JP2011/056683, dated Apr. 26, 2011.

Written Opinion of the International Searching Authority issued in PCT/JP2011/056683, dated Apr. 26, 2011.

* cited by examiner

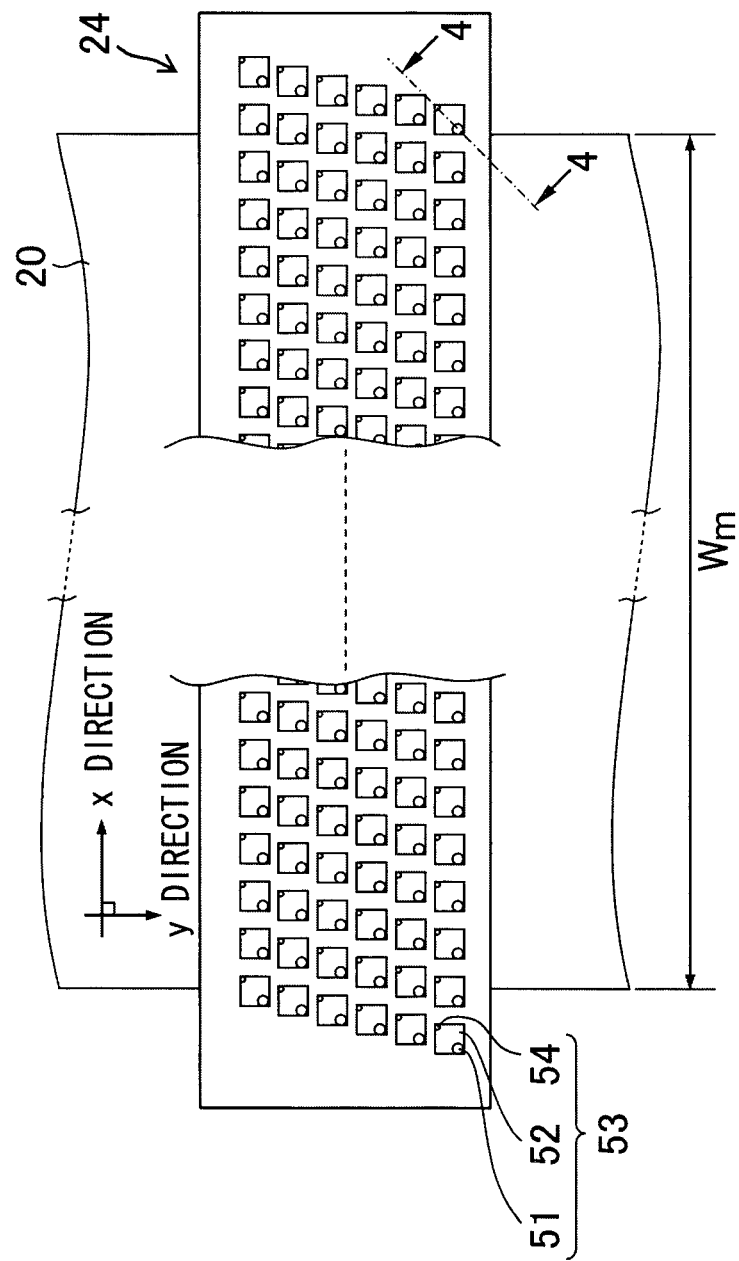

LIQUID APPLICATION APPARATUS, LIQUID APPLICATION METHOD AND IMPRINTING SYSTEM

TECHNICAL FIELD

The present invention relates to a liquid application apparatus, a liquid application method and an imprinting system, and more particularly, to liquid deposition technology for depositing liquid having functional properties onto a medium, such as a substrate, by an inkjet method.

BACKGROUND ART

With the development of increasingly fine semiconductor integrated circuits and higher levels of integration in recent years, a so-called imprint lithography method is known as technology for forming a fine structure on a substrate, in which a fine pattern is transferred by applying a resist (e.g., UV-curable resin) onto a substrate, curing the resist by irradiation of UV light in a state where a stamper formed with a desired projection-recess pattern to be transferred is pressed against the resist, and separating the stamper from the resist on the substrate.

PTL 1 and 2 disclose systems for depositing liquid of imprinting material onto substrates using an inkjet method. These systems optimize the droplet deposition amount by changing the droplet deposition density and the droplet ejection volume in accordance with a pattern and an amount of evaporation of the imprinting material (resist) when applying a prescribed amount of liquid onto a substrate, and thereby improving the throughput and uniformizing the thickness of the resist applied on the substrate.

CITATION LIST

Patent Literature

PTL 1: WO 2005/120834
PTL 2: Japanese Patent Application Publication No. 2009-088376

SUMMARY OF INVENTION

Technical Problem

PTL 1 and 2 only describe algorithms relating to which droplet deposition arrangements are desirable, and do not teach or suggest specific compositions, such as hardware for achieving ideal droplet deposition density or droplet ejection volume.

Solution to Problem

The present invention has been contrived in view of these circumstances, an object thereof being to provide a pattern transfer apparatus, a pattern transfer method and an imprinting system whereby it is possible to change droplet deposition pitches of liquid respectively in an x direction and a y direction, and thereby the arrangement of the liquid on the substrate can be optimized.

In order to attain the aforementioned object, the present invention is directed to a liquid application apparatus, comprising: a head including a plurality of nozzles which eject droplets of liquid having functional properties toward a substrate; a relative movement device which causes the head and the substrate to move relatively to each other in a relative movement direction; a droplet ejection control device which operates the head at a prescribed droplet ejection period so as to deposit the droplets discretely onto the substrate; an x-direction droplet deposition pitch changing device which changes a deposition pitch of the droplets on the substrate in an x direction perpendicular to the relative movement direction; and a y-direction droplet deposition pitch changing device which changes a deposition pitch of the droplets on the substrate in a y direction parallel to the relative movement direction.

According to this aspect of the present invention, since the liquid application apparatus which deposits the droplets of the liquid having functional properties discretely on the substrate using the head including the plurality of nozzles which eject the droplets of the liquid to the substrate by operating the head at the prescribed droplet ejection period while causing the head and the substrate to move relatively to each other in the relative movement direction, includes the x-direction droplet deposition pitch changing device which changes the deposition pitch of the droplets on the substrate in the x direction perpendicular to the relative movement direction; and the y-direction droplet deposition pitch changing device which changes the deposition pitch of the droplets on the substrate in the y direction parallel to the relative movement direction, and hence the arrangement of liquid on the substrate can be optimized.

The "liquid having functional properties" in the present specification includes liquid containing a functional material which can form a fine pattern on a substrate, one example thereof being a resist solution.

One example of the head according to this aspect of the present invention is a mode including: a liquid chamber connected to the nozzle; a pressure application device which applies pressure to the liquid in the liquid chamber; a supply flow channel which supplies the liquid to the liquid chamber; and a supply port (restrictor section) arranged between the liquid chamber and the supply flow channel.

Preferably, the head has a structure in which the nozzles are arranged in a matrix configuration in a row direction parallel to the x direction and an column direction oblique to the y direction; and the droplet ejection control device also serves as the x-direction droplet deposition pitch changing device that switches the nozzles used among the nozzles in the head so as to change the deposition pitch of the droplets on the substrate in the x direction in units of n times a nozzle pitch in a projected nozzle group of the nozzles projected to an alignment in the x direction, where n is a positive integer.

It is also preferable that the head has a structure in which the nozzles are arranged in a matrix configuration in a row direction oblique to the x direction and an column direction oblique to the y direction and nonparallel to the row direction; and the droplet ejection control device also serves as the x-direction droplet deposition pitch changing device that switches the nozzles used among the nozzles in the head so as to change the deposition pitch of the droplets on the substrate in the x direction in units of n times a nozzle pitch in a projected nozzle group of the nozzles projected to an alignment in the x direction, where n is a positive integer.

According to these aspects of the present invention, it is possible to change the droplet deposition pitch by switching the nozzles used in the x direction, and the arrangement of liquid is optimized.

In this case, one example of a mode where the arrangement of deposited droplets is made discrete in the x direction is a mode where the standard droplet deposition pitch in the x direction is set to the repetition pitch of the matrix arrangement of the nozzles.

Preferably, the liquid application apparatus further comprises: a plurality of supply flow channels which supply the liquid to liquid chambers connected respectively to the nozzles, wherein the droplet ejection control device operates the head so as not to eject the droplets at a same droplet ejection timing from the nozzles connected to the liquid chambers to which a same one of the supply flow channels supplies the liquid.

According to this aspect of the present invention, cross-talk between the nozzles which are driven at the same timing is prevented and desirable droplet ejection of the liquid is achieved.

Preferably, the droplet ejection control device operates the head so as not to eject the droplets at a same droplet ejection timing from the nozzles which are separated from each other by a minimum nozzle pitch in the x direction in the head.

According to this aspect of the present invention, mechanical cross-talk is prevented by not performing the droplet ejection simultaneously from the nozzles which are most closely adjacent in the x direction, and desirable ejection of liquid droplets is achieved.

Preferably, the head has a structure in which the nozzles are arranged in the x direction; and the x-direction droplet deposition pitch changing device includes a turning device which turns the head in an x-y plane.

According to this aspect of the present invention, it is possible to change the droplet deposition pitch in the x direction by turning the head in the x-y plane, even if there is only one nozzle group in which the nozzles are aligned in the x direction.

Preferably, the head has a structure in which sub-heads are joined together in the x direction, each of the sub-heads having a structure in which the nozzles are arranged in the x direction; and the x-direction droplet deposition pitch changing device includes: a sub-head turning device which turns each of the sub-heads in the x-y plane; and an x-direction movement device which moves at least one of the sub-heads in the x direction.

According to this aspect of the present invention, by turning the respective sub-heads in the head having the structure in which the plurality of sub-heads are joined together in the x direction, it is possible to change the droplet deposition pitch in the x direction within one sub-head and furthermore, by adjusting the position in the x direction between sub-heads, it is possible to adjust the droplet deposition pitch in the x direction of the overall head.

Preferably, the droplet ejection control device operates the head at a period of at least m times a minimum droplet ejection period so as to deposit the droplets discretely on the substrate, where m is an integer larger than 1; and the droplet ejection control device also serves as the y-direction droplet deposition pitch changing device that includes a delay time generation device which generates, with the minimum droplet ejection period as a minimum unit, a delay time of not shorter than the minimum droplet ejection period and not longer than (m−1) times the minimum droplet ejection period, and delays a drive timing of the head by using the delay time generated by the delay time generation device to change the deposition pitch of the droplets on the substrate in the y direction in units of the minimum droplet ejection period.

According to this aspect of the present invention, it is possible to change the droplet deposition pitch in the y direction by controlling the droplet ejection, in units of the minimum droplet ejection period, and desirable arrangement of the liquid can be achieved.

It is also preferable that the liquid application apparatus further comprises: a scanning device which causes the head to scan the substrate in the x direction, wherein: the head includes at least one nozzle group in which the nozzles are arranged in the y direction; and the y-direction droplet deposition pitch changing device includes a turning device which turns the head in an x-y plane.

According to this aspect of the present invention, in the serial method of this kind, it is possible to change the droplet deposition pitch in the x direction by turning the head within a plane, and desirable arrangement of the liquid is achieved.

If a composition is adopted in which a portion of the nozzles are selected from the nozzles aligned in the y direction and the nozzles thus selected are switched with each scanning in the x direction, then it is possible to reduce the use frequency of the nozzles and increased lifespan of the head can be achieved.

Preferably, the head has a structure in which sub-heads are joined together in the y direction, each of the sub-heads having a structure in which the nozzles are arranged in the y direction; and the y-direction droplet deposition pitch changing device includes: a sub-head turning device which turns each of the sub-heads in the x-y plane; and a y-direction movement device which moves at least one of the sub-heads in the y direction.

According to this aspect of the present invention, it is possible to move a portion of the plurality of sub-heads in the y direction, or to move all of the plurality of sub-heads in the y direction.

Preferably, the droplet ejection control device operates the head at a period of at least m times a minimum droplet ejection period so as to deposit the droplets discretely on the substrate, where m is an integer larger than 1; and the droplet ejection control device also serves as the x-direction droplet deposition pitch changing device that includes a delay time generation device which generates, with the minimum droplet ejection period as a minimum unit, a delay time of not shorter than the minimum droplet ejection period and not longer than (m−1) times the minimum droplet ejection period, and delays a drive timing of the head by using the delay time generated by the delay time generation device to change the deposition pitch of the droplets on the substrate in the x direction in units of the minimum droplet ejection period.

According to this aspect of the present invention, in the serial method, it is possible to change the droplet deposition pitch in the x direction by controlling the droplet ejection, in units of the minimum droplet ejection period, and desirable arrangement of the liquid can be achieved.

In order to attain the aforementioned object, the present invention is also directed to a liquid application method which deposits droplets of liquid having functional properties discretely on a substrate using a head including a plurality of nozzles which eject the droplets of the liquid to the substrate by operating the head at a prescribed droplet ejection period while causing the head and the substrate to move relatively to each other in a relative movement direction, the method comprising: an x-direction droplet deposition pitch changing step of changing a deposition pitch of the droplets on the substrate in an x direction perpendicular to the relative movement direction; and a y-direction droplet deposition pitch changing step of changing a deposition pitch of the droplets on the substrate in a y direction parallel to the relative movement direction.

If using the head having the matrix arrangement, a desirable mode is one where the droplets of the liquid are arranged discretely in the x direction by simultaneously driving the nozzles spaced several nozzles apart in the x direction.

In order to attain the aforementioned object, the present invention is also directed to an imprinting system, comprising: a head including a plurality of nozzles which eject droplets of liquid having functional properties toward a substrate; a relative movement device which causes the head and the substrate to move relatively to each other in a relative movement direction; a droplet ejection control device which operates the head at a prescribed droplet ejection period so as to deposit the droplets discretely onto the substrate; an x-direction droplet deposition pitch changing device which changes a deposition pitch of the droplets on the substrate in an x direction perpendicular to the relative movement direction; a y-direction droplet deposition pitch changing device which changes a deposition pitch of the droplets on the substrate in a y direction parallel to the relative movement direction; a curing device which cures the liquid that has been applied to the substrate; and a pattern transfer device which presses a die in which a projection-recess pattern is formed against the liquid that is during a course of curing by the curing device or has been cured by the curing device, thereby transferring the projection-recess pattern.

According to the present invention, it is possible to change the droplet deposition pitch of the liquid independently in the x direction and the y direction, and therefore arrangement of the liquid droplets is optimized. Consequently, wetting properties are improved, variation in the residual thickness is reduced, and a desirable fine pattern can be formed on the substrate.

Advantageous Effects of Invention

According to the present invention, it is possible to change deposition pitches of droplets of liquid respectively in an x direction and a y direction, and thereby the arrangement of the liquid on the substrate can be optimized.

BRIEF DESCRIPTION OF DRAWINGS

FIG. 2 is a plan view perspective diagram showing an embodiment of the structure of a head in the pattern transfer apparatus.

DESCRIPTION OF EMBODIMENTS

First Embodiment

<General Composition>

Figure 1:
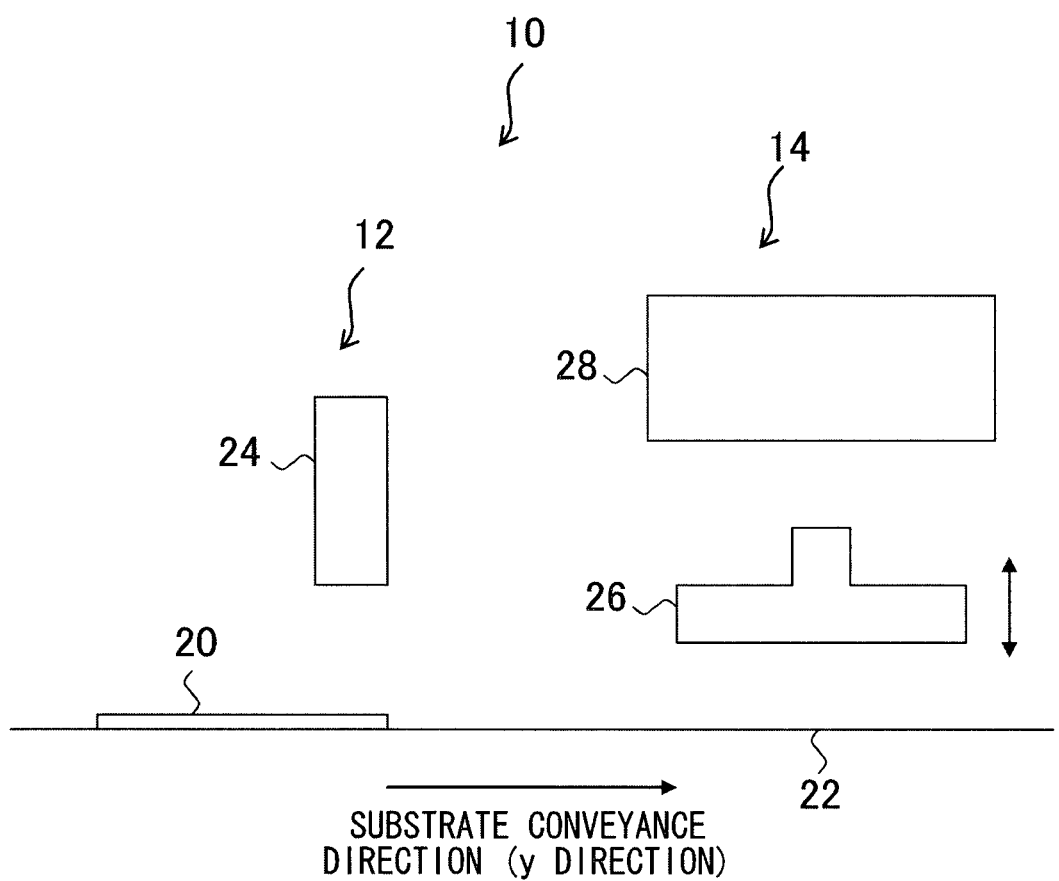
FIG. 1 is a general schematic drawing of a pattern transfer apparatus according to a first embodiment of the present invention.

FIG. 1 is a general schematic drawing of a pattern transfer apparatus according to the first embodiment of the present invention. The pattern transfer apparatus 10 shown in FIG. 1 includes: a resist application unit 12, which applies resist (e.g., UV-curable resin) onto a substrate 20 made of silicon or quarts glass, for example; a pattern transfer unit 14, which transfers a desired pattern to the resist that has been applied to the substrate 20; and a conveyance unit 22, which conveys the substrate 20.

The conveyance unit 22 includes a conveyance device, such as a belt, for example, and conveys the substrate 20 in a direction from the resist application unit 12 toward the pattern transfer unit 14 (hereinafter referred to as the "y direction", "substrate conveyance direction" or "sub-scanning direction") while holding the substrate 20 on the surface of the conveyance device. Instead of moving the substrate 20, it is also possible to move the resist application unit 12 and the pattern transfer unit 14 with respect to a stationary substrate.

The resist application unit 12 includes an inkjet head 24 (hereinafter referred to as the "head"), in which a plurality of nozzles 51 (not shown in FIG. 1, and shown in FIG. 2) are formed, and applies a solution of the resist onto a surface (resist application surface) of the substrate 20 by ejecting droplets of the resist solution from the nozzles 51.

The head 24 is constituted of a long full-line head, in which the nozzles 51 are arranged through the maximum width Wm (see FIG. 2) of the substrate 20 in the x direction (hereinafter referred to as a "substrate widthwise direction" or a "main scanning direction") perpendicular to the y direction. It is possible to arrange the droplets at desired positions on the substrate 20 by performing just one operation of moving the substrate 20 and the head 24 relatively in the substrate conveyance direction (sub-scanning direction), without moving the head 24 in the x direction, and therefore it is possible to raise the resist application rate.

The pattern transfer unit 14 includes: a stamper (die) 26, in which a desired projection-recess pattern to be transferred to the resist on the substrate 20 is formed; and a UV irradiation device 28, which irradiates UV light. The pattern transfer unit 14 transfers the pattern to the resist on the substrate 20 by irradiating UV light from the UV irradiation device 28 to cure the resist on the substrate 20 in a state where the stamper 26 is pressed against the surface of the substrate 20 to which the resist has been applied.

The stamper 26 is formed with a light-transmitting material that is capable of transmitting UV light irradiated by the UV irradiation device 28. It is possible to use glass, quartz, sapphire, transparent plastic (e.g., acrylic resin, hard vinyl chloride, or the like) as the light-transmitting material. By this means, when UV light is irradiated from the UV irradiation device 28 located above the stamper 26 (on the opposite side from the substrate 20), UV light is irradiated onto the resist on the substrate 20 without being shielded by the stamper 26 and the resist can therefore be cured.

The stamper 26 is arranged movably in the vertical direction in FIG. 1 (i.e., the directions represented with a double-headed arrow). The stamper 26 is moved downward while maintaining a state where the pattern forming surface of the stamper 26 is substantially parallel with the surface of the substrate 20, and is made in contact with the whole surface of the substrate 20 virtually simultaneously, thereby performing pattern transfer.

<Composition of Head>

Figure 3A:
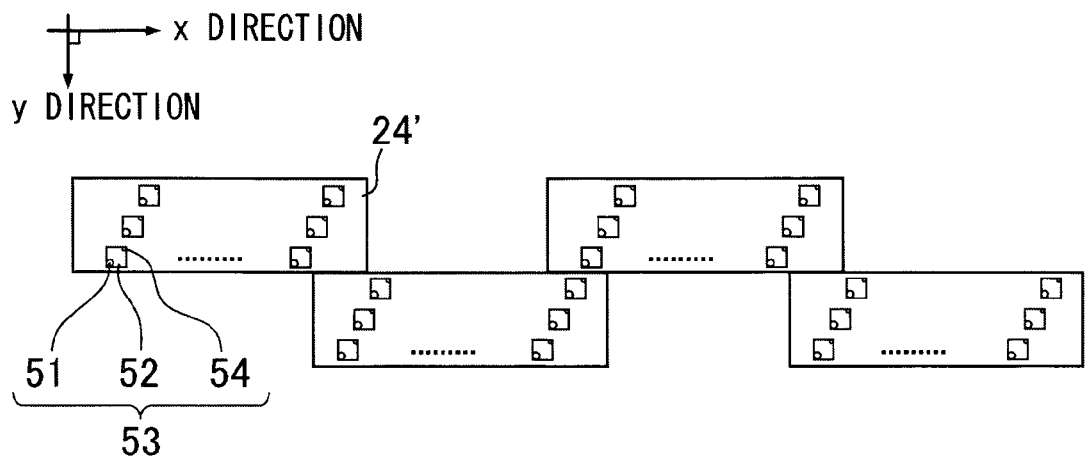
FIG. 3A is a plan view perspective diagram showing an embodiment of the composition of a line type head.
Figure 3B:
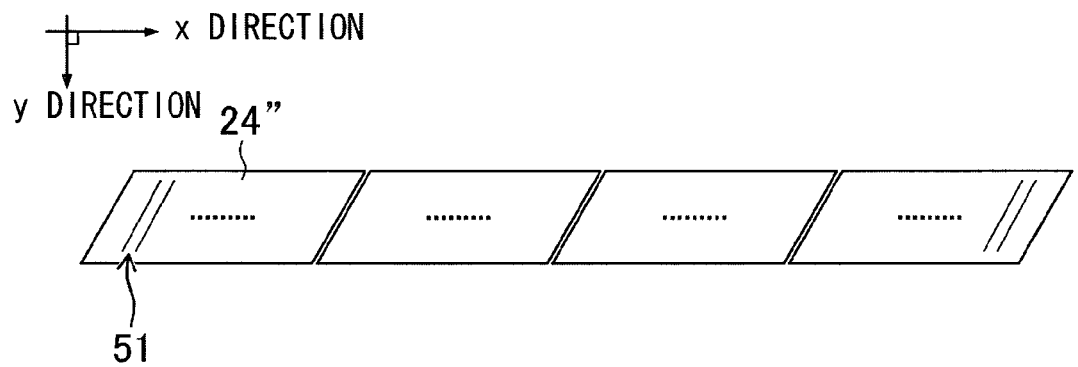
FIG. 3B is a plan view perspective diagram showing another embodiment of the composition of a line type head.
Figure 4:
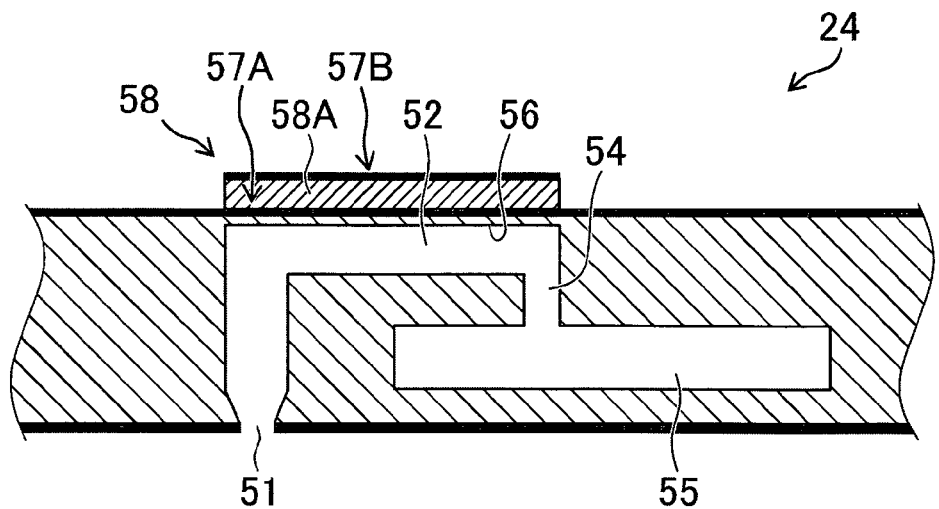
FIG. 4 is a cross-sectional diagram showing an inner structure of a droplet ejection element.

The structure of the head 24 is described in detail below. FIG. 2 is a plan view perspective diagram showing an embodiment of the structure of the head 24. FIGS. 3A and 3B are plan view perspective diagrams showing other embodiments of the structure of the head 24. FIG. 4 is a cross-sectional diagram showing an inner structure of a droplet ejection element (a cross-sectional diagram along line 4-4 in FIG. 2).

The nozzle pitch in the head 24 should be reduced in order to reduce the interval between the droplets deposited on the substrate 20. As shown in FIG. 2, the head 24 in the present embodiment has a structure in which a plurality of droplet ejection elements 53, each including a droplet ejection port or the nozzle 51, a pressure chamber 52 corresponding to the nozzle 51, and the like, are disposed two-dimensionally in the form of a staggered matrix, and hence the effective nozzle interval (the projected nozzle pitch) as projected in the lengthwise direction of the head (the x direction) is reduced and high nozzle density is achieved.

The mode of constituting one or more nozzle rows covering the length corresponding to the full width of the substrate 20 in the x direction is not limited to the present embodiment. For example, instead of the composition in FIG. 2, it is possible to adopt a mode shown in FIG. 3A in which a line head having nozzle rows of the length corresponding to the entire width of the substrate 20 is formed by arranging and combining, in a staggered matrix, short head modules (head chips) 24', each of which has a plurality of nozzles 51 arrayed two-dimensionally. It is also possible to adopt a mode shown in FIG. 3B in which a line head is composed by aligning short head modules 24" in one row. In FIG. 3B, the nozzles 51 which are aligned in a column direction oblique to the x direction are depicted jointly as one line.

As shown in FIG. 2, the planar shape of the pressure chamber 52 arranged for each nozzle 51 is substantially a square, and the nozzle 51 and the supply port 54 are disposed in respective corner portions on a diagonal line of the square. As shown in FIG. 4, each pressure chamber 52 is connected to a common flow channel 55 through the supply port 54.

Piezoelectric elements 58 are bonded to a diaphragm 56, which constitutes a ceiling face of the pressure chambers 52. Each of the piezoelectric elements 58 has a structure in which a piezoelectric body 58A is placed between a lower electrode 57A and an upper electrode (individual electrode) 57B. The piezoelectric element 58 is deformed by applying a drive voltage between the lower electrode 57A and the upper electrode 57B, thereby applying pressure to the liquid in the pressure chamber 52, and a droplet of the liquid is ejected from the nozzle 51 that is connected to the pressure chamber 52. When the droplet of the liquid is ejected, new liquid is supplied to the pressure chamber 52 from the common flow channel 55 through the supply port 54. If a metal material is used for the diaphragm 56, then it is possible that the diaphragm 56 also serves as the common electrode or the lower electrodes 57A.

In the present embodiment, the piezoelectric elements 58 are employed as ejection pressure generating devices for the liquid ejected from the nozzles 51 arranged in the head 24; however, it is also possible to employ a thermal method in which heaters are arranged inside the pressure chambers 52, and the liquid is ejected by using the pressure of film boiling produced by heating by the heaters.

As shown in FIG. 2, the high-density nozzle head according to the present embodiment is achieved by arranging the droplet ejection elements 53 having the above-described structure in a lattice fashion based on a fixed arrangement pattern, in a row direction which coincides with the x direction, and a column direction which is inclined at a fixed angle with respect to the x direction, rather than being perpendicular to the x direction.

More specifically, by adopting a structure in which the droplet ejection elements 53 are arranged at a uniform pitch d in line with the direction forming the angle of θ with respect to the x direction, a pitch $P_n$ of the nozzles projected so as to align in the x direction is d×cos θ, and hence the nozzles 51 can be regarded to be equivalent to those arranged linearly at the fixed pitch $P_n$ along the x direction. Such configuration results in a nozzle structure in which the nozzle row projected in the main scanning direction has a high nozzle density of up to 2,400 nozzles per inch.

<Description of Control System>

Figure 5:
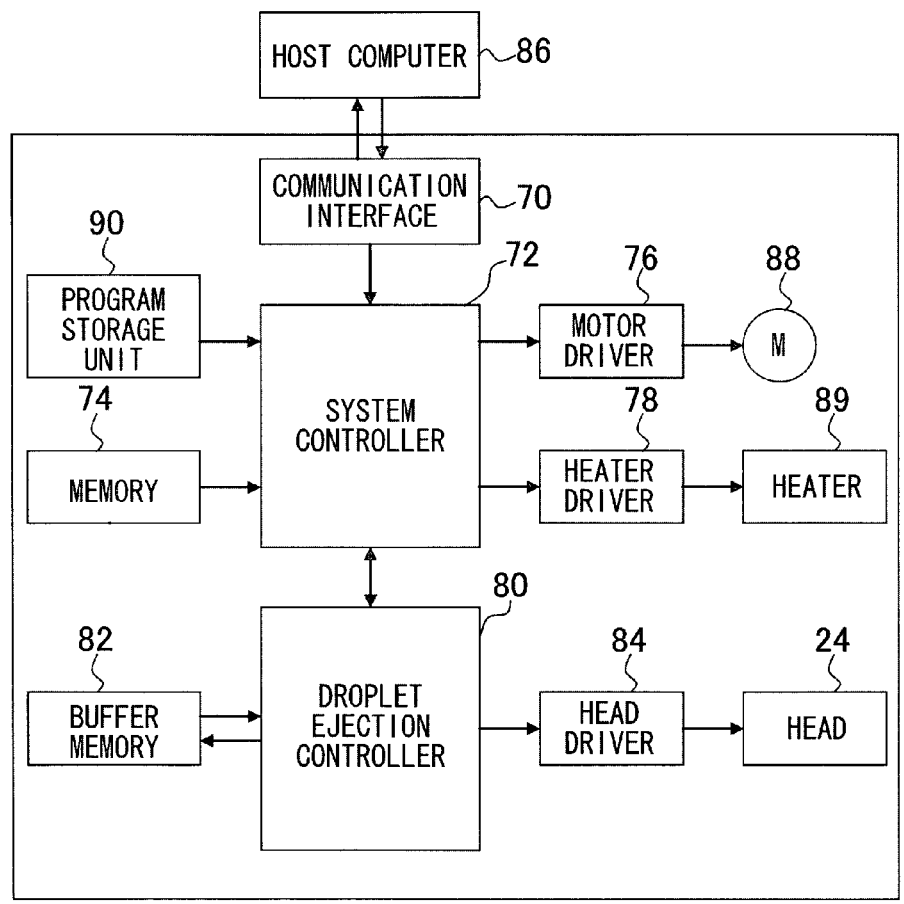
FIG. 5 is a principal block diagram showing the control system of the pattern transfer apparatus in FIG. 1.

FIG. 5 is a block diagram showing the control system of the pattern transfer apparatus 10. As shown in FIG. 5, the pattern transfer apparatus 10 includes a communication interface 70, a system controller 72, a memory 74, a motor driver 76, a heater driver 78, a droplet ejection controller 80, a buffer memory 82, a head driver 84, and the like.

The communication interface 70 is an interface unit for receiving data indicating the arrangement of resist solution (application pattern) sent from a host computer 86. A serial interface such as USB (Universal Serial Bus), IEEE1394, Ethernet, wireless network, or a parallel interface such as a Centronics interface can be used as the communication interface 70. A buffer memory (not shown) can be mounted in the communication interface 70 in order to increase the communication speed.

The system controller 72 is a control unit which controls the respective units of the communication interface 70, the memory 74, the motor driver 76, the heater driver 78, and the like. The system controller 72 is constituted of a central processing unit (CPU) and peripheral circuits, and the like, and controls communications with the host computer 86, and reading and writing of data from and to the memory 74, as well as generating control signals to control motors 88 and heaters 89 of the conveyance system.

The memory 74 is a storage device which includes a temporary storage area for data and a work area for the system controller 72 to carry out calculations. The data indicating the arrangement of resist solution that has been input through the communication interface 70 is read into the pattern transfer apparatus 10 and stored temporarily in the memory 74. Apart from a memory constituted of semiconductor devices, it is also possible to use a magnetic medium, such as a hard disk, for the memory 74.

A control program for the pattern transfer apparatus 10 is stored in the program storage unit 90. The system controller 72 reads out various control programs stored in the program storage unit 90, as appropriate, and executes the read control programs. The program storage unit 90 can employ a semiconductor memory, such as a ROM or EEPROM, or may use a magnetic disk, or the like. The program storage unit 90 can be provided with an external interface to use a memory card or a PC card. Of course, it is also possible to arrange a plurality of recording media, of these recording media.

The motor driver 76 is a drive circuit which drives the motors 88 in accordance with instructions from the system controller 72. The motors 50 include a motor for driving the conveyance unit 22 in FIG. 1 and a motor for raising and lowering the stamper 26.

The heater driver 78 is a drive circuit which drives the heaters 89 in accordance with instructions from the system controller 72. The heaters 89 include temperature adjustment heaters arranged in the respective sections of the pattern transfer apparatus 10.

The droplet ejection controller 80 has signal processing functions for performing processing such as correction processing, and various types of processing for generating droplet ejection control signals from the resist solution arrangement data stored in the memory 74 in accordance with commands from the system controller 72 so as to supply the generated droplet ejection control signals to the head driver 84. Prescribed signal processing is carried out in the droplet ejection controller 80, and the ejection amounts, the deposition positions and the ejection timing of droplets of the resist solution from the head 24 are controlled through the head driver 84, on the basis of the droplet ejection data. By this means, a desired arrangement (pattern) of droplets of the resist solution is achieved. In the drive method employed in the pattern transfer apparatus 10 according to the present embodiment, a common drive waveform is prepared for all of the piezoelectric elements, and switching elements arranged for the piezoelectric elements are switched on and off, thereby switching whether or not the drive waveform is applied to each of the piezoelectric elements. The drive waveform includes waveform elements corresponding to three droplet ejection volumes, and the droplet ejection volume is changed by selecting a suitable waveform element for each nozzle and each droplet ejection timing, of which details are described below The droplet ejection controller 80 is provided with the buffer memory 82; and droplet ejection data, parameters, and other data are temporarily stored in the buffer memory 82 when the droplet ejection data is processed in the droplet ejection controller 80. The aspect shown in FIG. 5 is one in which the buffer memory 82 accompanies the droplet ejection controller 80; however, the memory 74 can also serve as the buffer memory 82. Also possible is an aspect in which the droplet ejection controller 80 and the system controller 72 are integrated to form a single processor.

The head driver 84 generates drive signals for driving the piezoelectric elements 58 (see FIG. 4) in the head 24, on the basis of droplet ejection data supplied from the droplet ejection controller 80, and supplies the generated drive signals to the piezoelectric elements 58. The head driver 84 can also incorporate a feedback control system for maintaining uniform drive conditions in the head 24.

<Description of Drive Signal Generating Unit>

Figure 6:
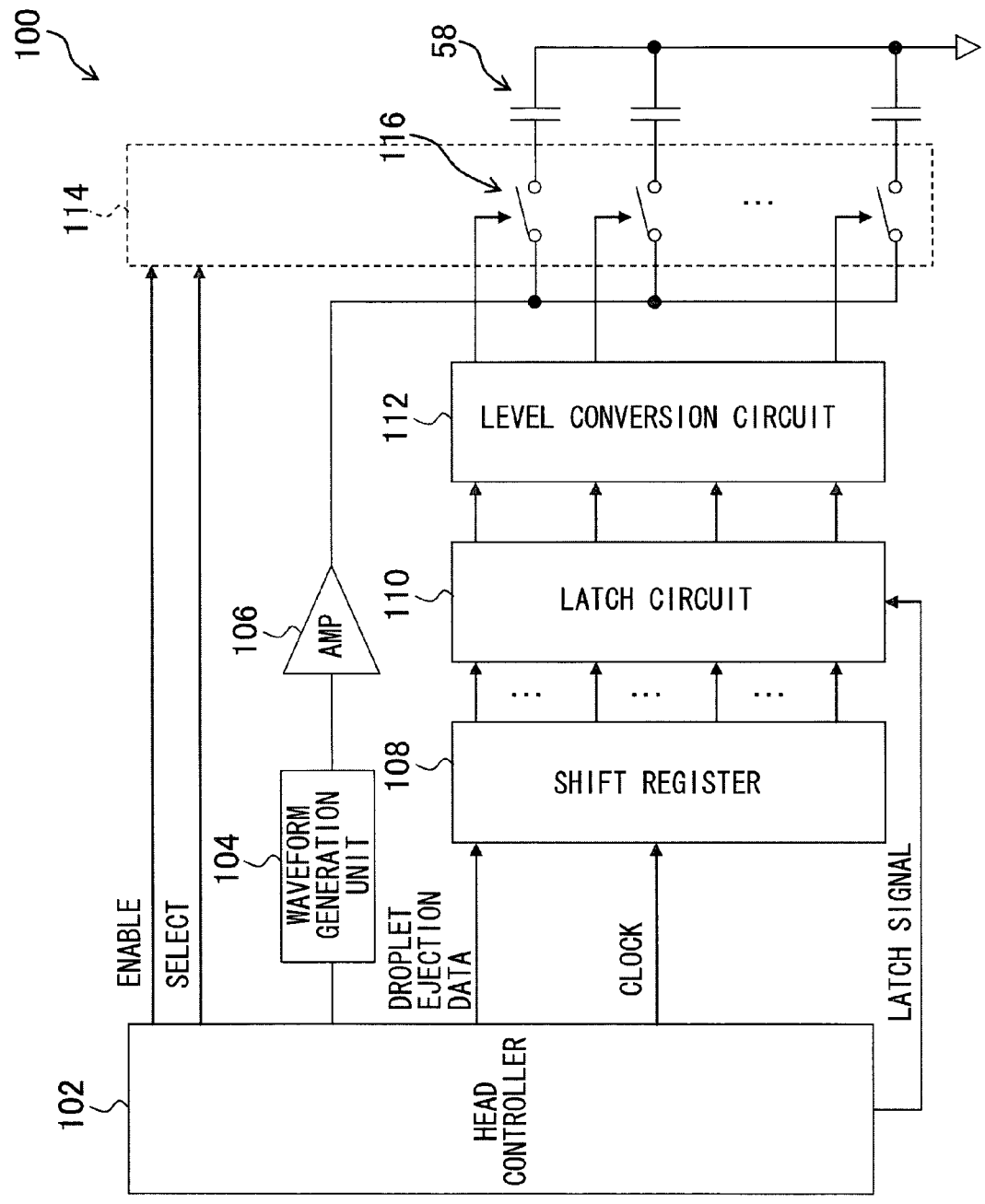
FIG. 6 is a block diagram showing an embodiment of the composition of a head driver in the control system in FIG. 5.

FIG. 6 is a block diagram showing the composition of a drive signal generating unit 100, which generates the drive signals to be supplied to the piezoelectric elements 58, according to an embodiment of the present invention. The drive signal generating unit 100 is a block that achieves the functions of the droplet ejection controller 80 and the head driver 84 in FIG. 5.

The drive signal generating unit 100 shown in FIG. 6 includes: a waveform generating unit 104, which generates an analogue waveform signal (drive waveform) on the basis of a digital waveform signal transferred from a head controller 102; and an amplifier unit (AMP) 106, which amplifies the voltage and current of the drive waveform. The serial droplet ejection data transferred from the head controller 102 is sent to a shift register 108, together with a clock signal, in synchronism with the clock signal. The drive waveform generated by the drive waveform generating unit 104 includes a plurality of waveform elements (see FIG. 8). By selecting one or more of waveform elements from the plurality of waveform elements, it is possible to stepwise change the droplet ejection volume of the resist solution.

The droplet ejection data stored in the shift register 108 is latched in a latch circuit 110 on the basis of a latch signal sent from the head controller 102. The signal latched by the latch circuit 110 is converted in a level conversion circuit 112 to a signal of prescribed voltage capable of driving switching elements 116, which constitutes a switch IC 114. By controlling the on/off switching of the switching elements 116 by means of the output signal from the level conversion circuit 112, at least one waveform element is selected from the plurality of waveform elements and thereby the droplet ejection volume is set, and the piezoelectric element 58 (nozzle 51) to be driven is selected by means of a select signal and an enable signal output from the head controller 102.

In the pattern transfer apparatus 10 having the composition described above, when the substrate 20 is conveyed to the resist application unit 12, droplets of the resist solution are ejected toward the substrate 20 from the nozzles 51 in the recording head 24, and thereby the resist solution is applied on the substrate 20 in accordance with the prescribed pattern. Thereupon, when the substrate 20 to which the resist solution has been applied is conveyed to the pattern transfer unit 14, the stamper 26 is pressed against the resist solution on the substrate 20, UV light is then irradiated to the resist solution from the UV irradiation device 28, and thereby the resist on the substrate 20 is cured. Then, the stamper 26 is separated from the resist on the substrate 20. Thus, the prescribed fine pattern is transferred to the resist on the substrate 20.

In the pattern transfer apparatus 10 according to the present embodiment, when the resist solution is applied to the substrate 20 in the resist application unit 12, droplets of the resist solution are discretely deposited on the substrate 20 in such a manner that one droplet does not combine with any other droplets that are adjacent on the substrate 20.

More specifically, droplet ejection from the nozzles is controlled in such a manner that droplet ejection is not performed at the same droplet ejection timing from the nozzles which are adjacent to each other in the x direction (i.e., the nozzles separated by the shortest distance in the x direction), and in respect of the y direction, droplet ejection from the nozzles is controlled in such a manner that droplet ejection is not performed at consecutive droplet ejection timings from the nozzles which are adjacent to each other in the y direction (i.e., the nozzles separated by the shortest distance in the y direction).

<Description of Droplet Deposition Arrangement in x Direction>

Figure 7:
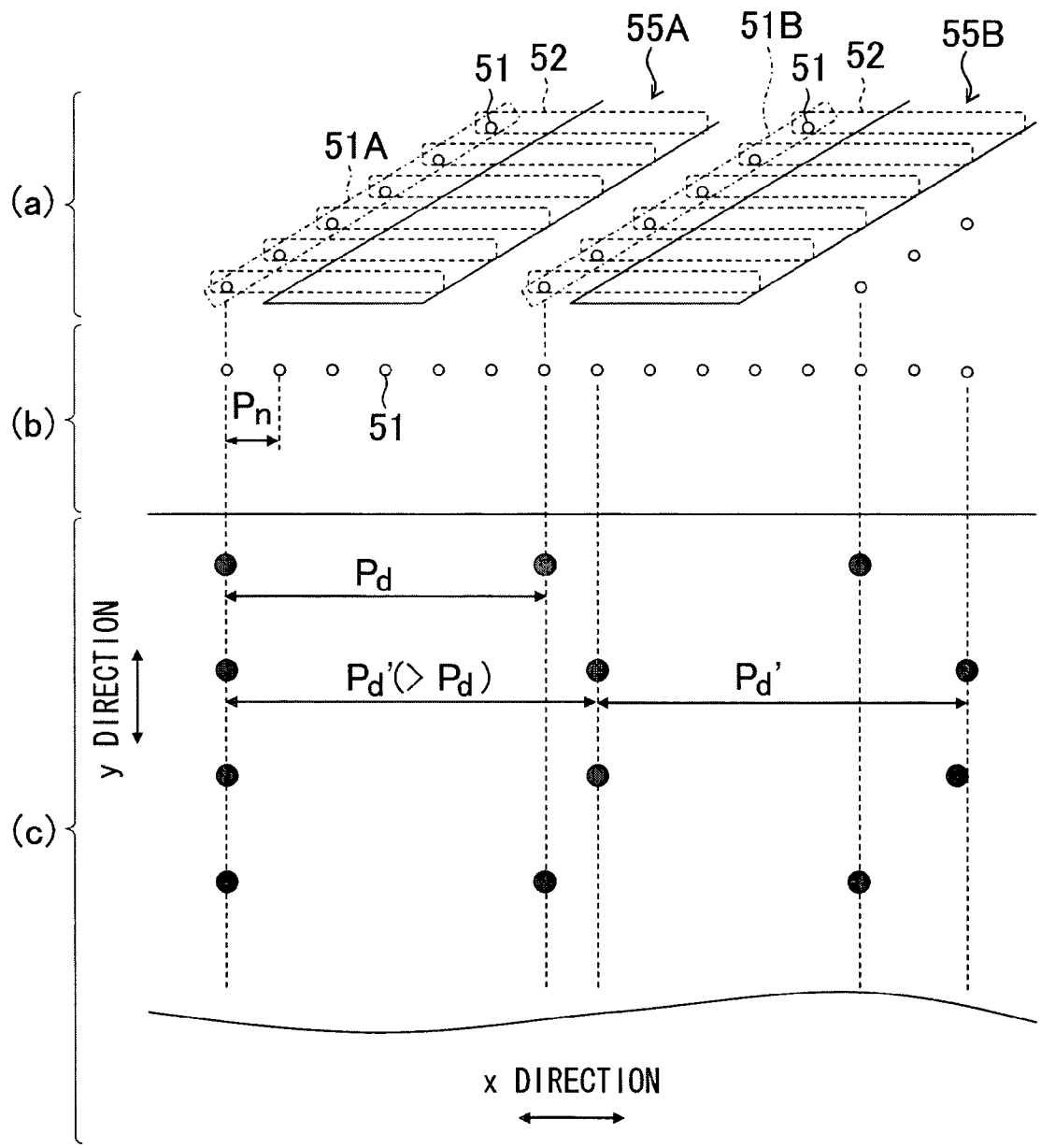
FIG. 7 is a diagram illustrating a relationship between an x-direction nozzle arrangement and a droplet deposition arrangement.

The deposition arrangement (deposition pitch) of the resist solution droplets in the x direction is described below. FIG. 7 is a diagram showing the relationship between the nozzle arrangement and the droplet deposition arrangement in the x direction. Part (a) in FIG. 7 shows a schematic view of the nozzles 51 (the pressure chambers 52) which are arranged in the matrix configuration, and for the sake of the drawing, the number of nozzles is reduced in comparison with FIG. 2. Part (b) in FIG. 7 represents the nozzles which are projected to an alignment in the x direction. Part (c) in FIG. 7 represents the deposition positions of the resist solution droplets (indicated with solid circles).

As shown in the part (a) in FIG. 7, the nozzles 51 which are aligned in one row in the column direction are connected to one common distributary flow channel 55. For example, the nozzles 51 constituting a nozzle group 51A on the left-hand side in FIG. 7 are connected to a common flow channel 55A on the left-hand side, and the nozzles 51 constituting a nozzle group 51B second from the left-hand side in FIG. 7 are connected to a common flow channel 55B second from the left-hand side. The nozzle pitch in the projected nozzle group shown in the part (b) in FIG. 7 (the minimum pitch between the nozzles in the x direction) is $P_n$.

As shown in the part (c) in FIG. 7, the standard deposition pitch $P_d$ of the resist solution droplets in the x direction is equal to the periodic unit length of the matrix arrangement of the nozzles 51, and $P_d$="the number of the nozzles constituting one-column nozzle group"×P. If droplet ejection operations are performed simultaneously from the nozzles connected to the same common flow channel 55, then cross-talk may occur and variations may arise in the droplet ejection volume and the droplet ejection direction. Hence, in order to effectively prevent the cross-talk, no droplet ejection operations are performed simultaneously from the nozzles which are connected to the same common flow channel.

Furthermore, the droplet deposition pitch $P_d$ in the x direction is adjustable finely in units of the minimum nozzle pitch $P_n$ in the x direction. For example, in the nozzle group 51B second from the left-hand side in FIG. 7, the nozzle used is changed to the first adjacent nozzle to the right in the projected nozzle group, and in the nozzle group third from the left-hand side in FIG. 7, the nozzle used is changed to the second adjacent nozzle to the right in the projected nozzle group. In this way, the nozzle used in the nozzle group of the i-th from the left-hand side is changed to the nozzle that is the (i−1)-th adjacent nozzle to the right in the projected nozzle group, and thereby the droplet deposition pitch $P_d'$ can be made larger than the standard droplet deposition pitch $P_d$. By changing the deposition pitch $P_d$ of the resist solution droplets in the x direction in this way, in units of the minimum nozzle pitch $P_n$ (i.e., in positive integral multiples of $P_n$) in the x direction, it is possible to suitably change the density of the resist solution droplets in the x direction.

On the other hand, when the droplet deposition pitch is made smaller than the standard droplet deposition pitch $P_d$, the nozzles which eject the resist solution droplets toward mutually adjacent droplet deposition positions in the x direction are selected to be the nozzles of pressure chambers 52 which are not adjacent to each other in the y direction. Then, the minimum droplet deposition pitch in the x direction, $P_{dmin}$, is at least two times the minimum nozzle pitch $P_n$ in the x direction. If droplet ejection operations are performed simultaneously from the nozzles which are adjacent to each other in the y direction (the breadthways direction of the pressure chambers 52), then deformation occurs in the wall that demarcates the two pressure chambers 52 that are connected to the mutually adjacent nozzles and therefore mechanical cross-talk arises. This occurrence of cross-talk may cause variation in the droplet ejection volume or droplet ejection direction. Hence, in order to prevent the mechanical cross-talk, no droplet ejection operations are performed simultaneously from the nozzles which are adjacent to each other in the y direction.

<Description of Droplet Deposition Arrangement in y Direction>

Figure 8:
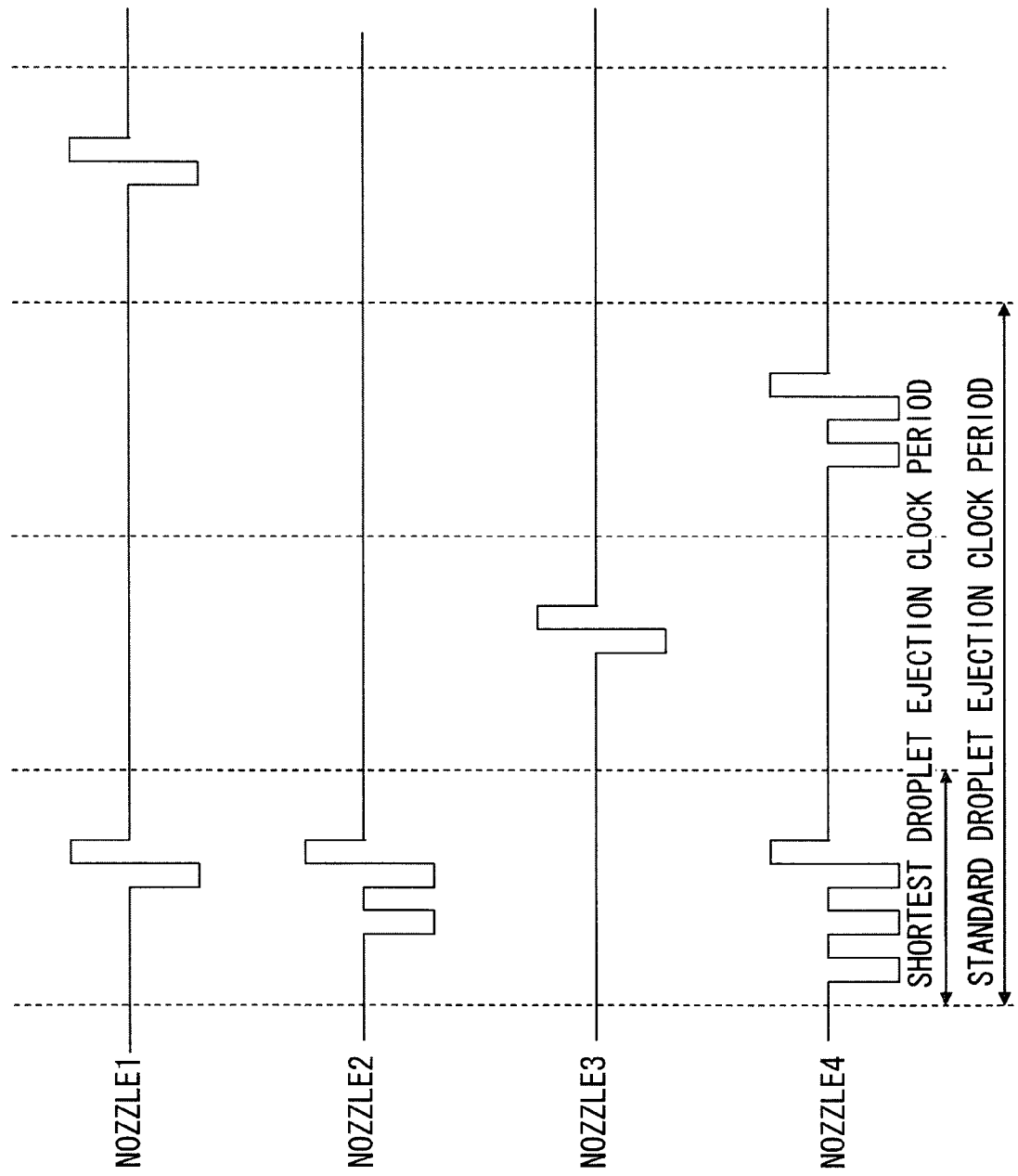
FIG. 8 is a diagram illustrating a relationship between a droplet ejection clock and droplet ejection timing.

The deposition arrangement of the resist solution droplets in the y direction is described below. FIG. 8 is an illustrative diagram showing a relationship between a droplet ejection clock and droplet ejection timing. The minimum droplet deposition pitch in the y direction is governed by the period of the droplet ejection clock and the conveyance speed of the substrate 20. The pattern transfer apparatus 10 in the present embodiment is composed in such a manner that the period of the standard droplet ejection clock is divided up further and droplet ejection can be performed between the standard droplet ejection clock timings. More specifically, the standard droplet ejection period is m times the minimum droplet ejection period (where m is an integer larger than 1), and the delay time can be specified in units of the minimum droplet ejection period.

In the example shown in FIG. 8, the period of the standard droplet ejection clock is divided into three, and droplet ejection can be performed at a timing delayed by ⅓ of the droplet ejection period from the standard droplet ejection timing or at a timing delayed by ⅔ of the droplet ejection period from the standard droplet ejection timing.

For example, droplet ejection is performed from the nozzles 1, 2 and 4 at the standard droplet ejection timing, and droplet ejection is performed from the nozzle 3 at a timing delayed by ⅓ of the droplet ejection period from the timing at which the droplet ejection is performed from the nozzles 1, 2 and 4. Moreover, the nozzle 4 performs a second droplet ejection at a timing ⅓ of the droplet ejection period earlier than the standard droplet ejection timing.

Thus, it is possible to change the droplet deposition pitch in the y direction, with a pitch smaller than the standard droplet deposition pitch in the y direction, and it is possible suitably to change the density of the resist solution droplets in the y direction as well. The differences between the drive waveforms of the nozzles 1 to 4 are differences in the droplet ejection volume of resist solution produced by one ejection operation. In the example shown in FIG. 8, the droplet ejection volume of the nozzle 2 and the second droplet ejection volume of the nozzle 4 are larger than the droplet ejection volume of the nozzles 1 and 3, and the first droplet ejection volume of the nozzle 4 is larger than the droplet ejection volume of the nozzle 2 and the second droplet ejection volume of the nozzle 4.

The droplet deposition pitch is varied on the basis of data about the arrangement of resist solution (application pattern). More specifically, if a larger number of droplets than standard is required in accordance with the resist solution pattern data, then the droplet deposition pitch is changed so to become smaller and the resist solution is applied more densely. On the other hand, if a larger droplet ejection volume than standard is not required, then the droplet deposition pitch is changed so as to become larger, and the resist solution is applied more sparsely. It is also possible to change the droplet ejection volume of the resist solution as described above, in accordance with the change in the droplet deposition pitch.

According to the pattern transfer apparatus 10 having the composition described above, which uses the resist application unit 12 that arranges resist solution droplets discretely by a standard droplet deposition pitch that exceeds the minimum nozzle pitch in the x direction and by a standard droplet ejection period that exceeds the minimum droplet ejection period in the y direction, using a head in which nozzles that eject droplets of resist solution are arranged in a matrix configuration, the droplet deposition pitch in the x direction is altered by changing the nozzle used in such a manner that the interval in the x direction between the nozzles which perform the droplet ejection at the same droplet ejection timing is changed in units of the minimum nozzle pitch $P_n$ in the x direction, and the droplet deposition pitch in the y direction is altered by changing the droplet ejection timing through setting a delay time in units of the minimum droplet ejection period from a standard droplet ejection timing. Therefore, the applied volume of resist solution is optimized in accordance with the density of the resist solution droplets to be deposited to the substrate, and improvement in wetting properties and variation in the residual thickness are reduced.

Moreover, the droplet deposition pitch can be altered independently in the x direction and the y direction, and the arrangement density of the droplets can be raised only in a portion of the substrate.

Furthermore, since the composition is adopted in which the nozzles used for droplet ejection are switched selectively from the plurality of nozzles (channels), then it is possible to reduce the frequency of use of the nozzles and increased lifespan of the head can be expected.

Figure 9:
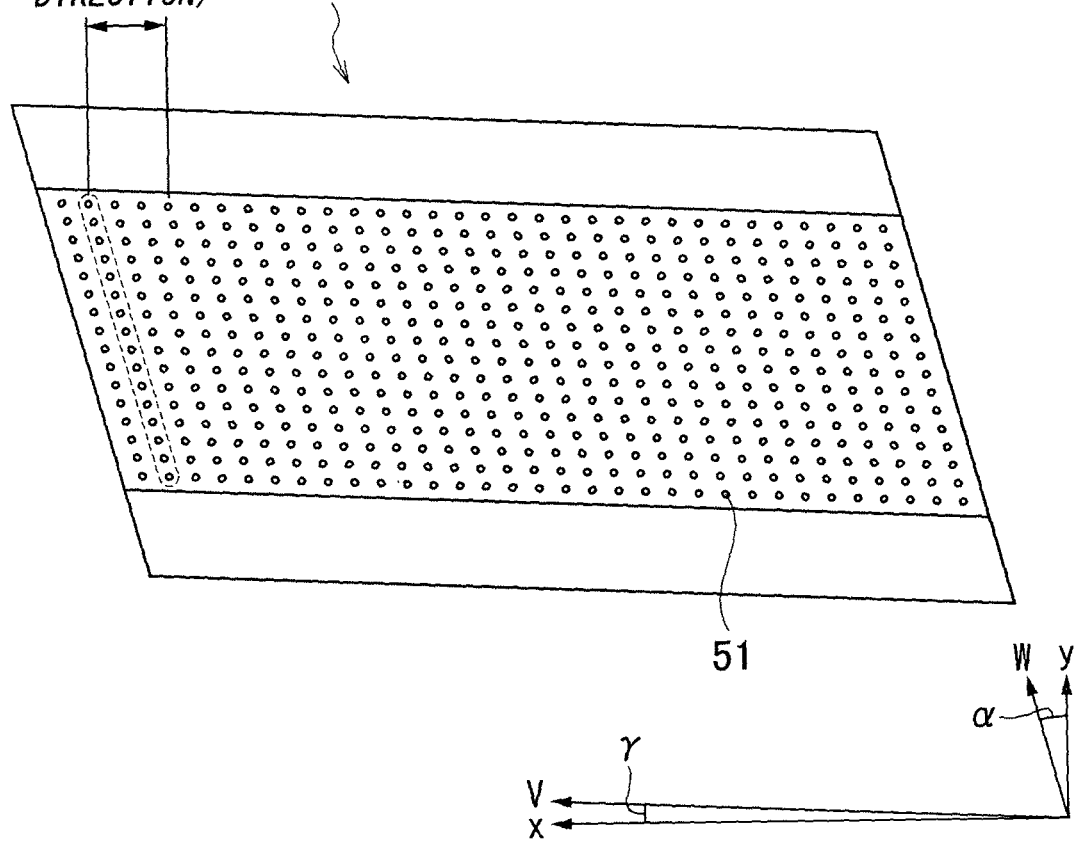
FIG. 9 is a plan diagram showing a further mode of a matrix arrangement of droplet ejection elements.

Instead of the nozzle arrangement shown in FIG. 2, it is also possible to employ another nozzle arrangement shown in FIG. 9. FIG. 9 is a plan diagram showing the matrix arrangement, and shows a view from the surface where droplets of resist solution are ejected. In a head module 224 shown in FIG. 9, the nozzles 51 are arranged in the matrix configuration following a row direction V that forms a prescribed angle of y with respect to the x direction, and a column direction W that forms a prescribed angle of a with respect to the y direction. The full line type head is composed by joining together the plurality of head modules 224 in the x direction as shown in FIG. 3B.

Figure 10:
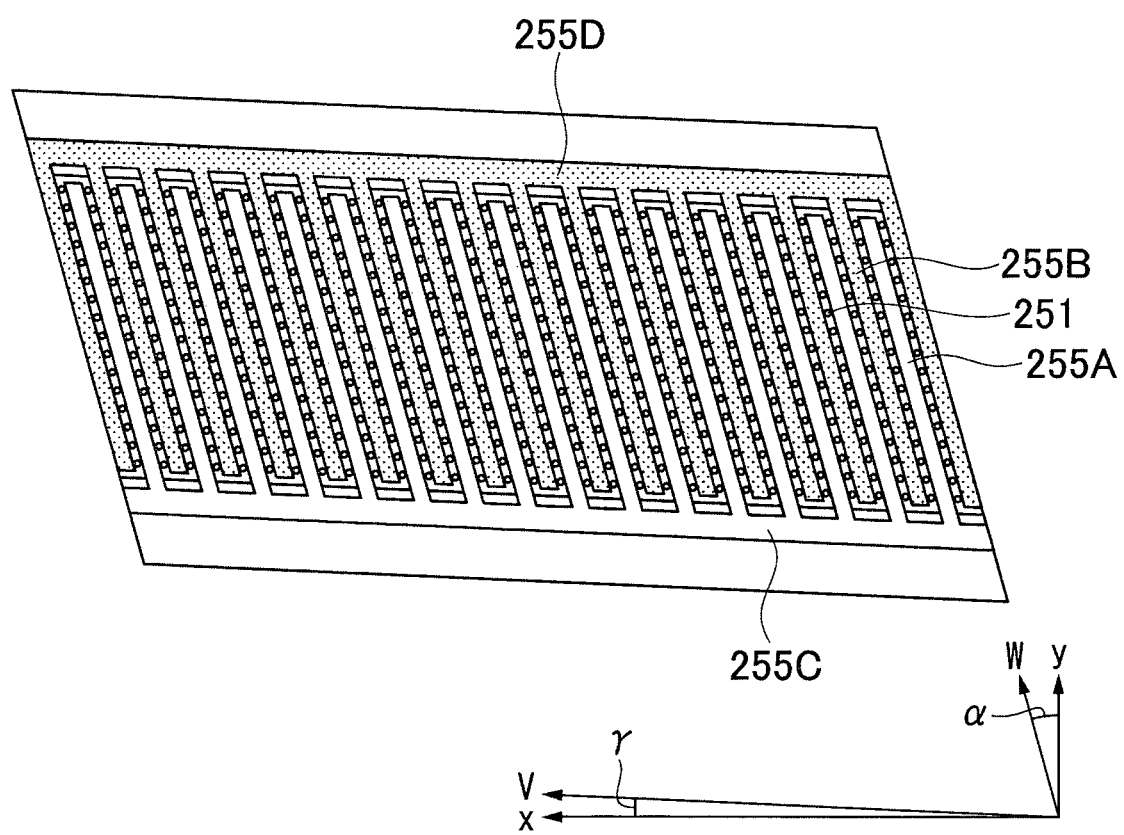
FIG. 10 is a plan view perspective diagram showing a structure of supply flow channels in the head shown in FIG. 9.

FIG. 10 is a plan view perspective diagram showing the internal structure of the head module 224 shown in FIG. 9. As shown in FIG. 10, for each nozzle group aligned in the column direction W in FIG. 10, a supply flow channel 255A and a return flow channel 255B are arranged on either side of the nozzle group. The supply flow channels 255A arranged following the column direction W are distributary flow channels which branch from a supply main flow channel 255C, which is connected to a supply tank (not shown) through a supply connection inlet (not shown). The return flow channels 255B are tributary flow channels which flow to a return main flow channel 255D, which is connected to a recovery tank (not shown) through a return connection outlet (not shown).

Figure 11:
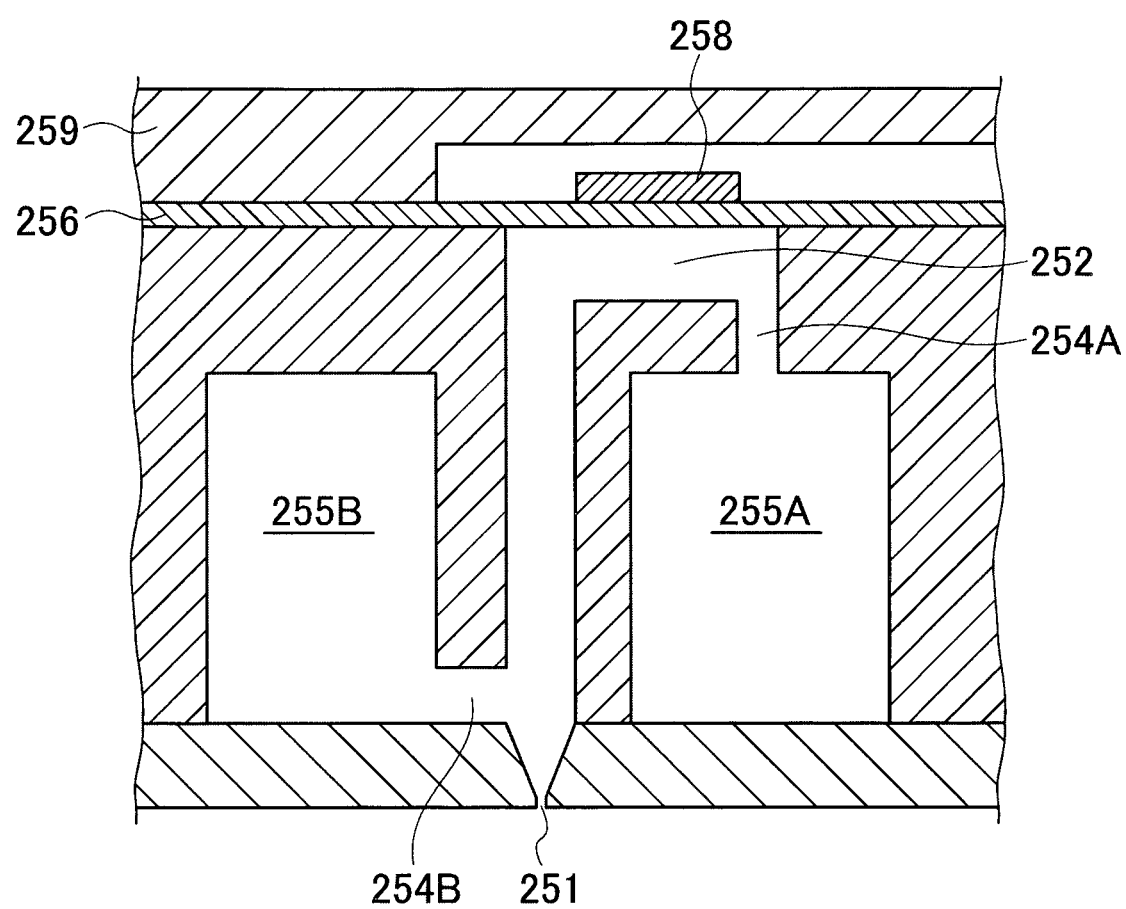
FIG. 11 is a cross-sectional diagram showing an inner structure of the head shown in FIG. 10.

FIG. 11 is a cross-sectional diagram showing the structure of flow channels inside the head module 224. The head module 224 has pressure chambers 252, a diaphragm 256, and piezoelectric elements 258. The head module 224 shown in FIG. 11 includes a cover plate 259, which closes off the periphery of the piezoelectric element 258 while ensuring a movable space for the piezoelectric element 258. Furthermore, although not shown in the drawings, a supply liquid chamber and a return liquid chamber are formed above the cover plate 259 and are connected respectively to the supply main flow channel 255C and the return main flow channel 255D through connection channels (not shown).

The resist solution is supplied to the pressure chamber 252 from the supply flow channel 255A through an individual supply channel 254A, and is ejected as a droplet from the nozzle 251 though a nozzle flow channel. The surplus liquid that has not been ejected is returned from the nozzle flow channel to the return flow channel 255B though an individual return channel 245B.

In the head module 224 having this flow channel structure, two nozzle columns share one individual supply channel, and hence the minimum droplet deposition pitch in the x direction between the nozzles that simultaneously perform droplet ejection operations is set to the length equivalent to four nozzle columns in the x-direction. Thus, no droplet ejection operations are simultaneously performed from the nozzles connected to the same individual supply channel, and crosstalk is effectively prevented.

Second Embodiment

Figure 12A:
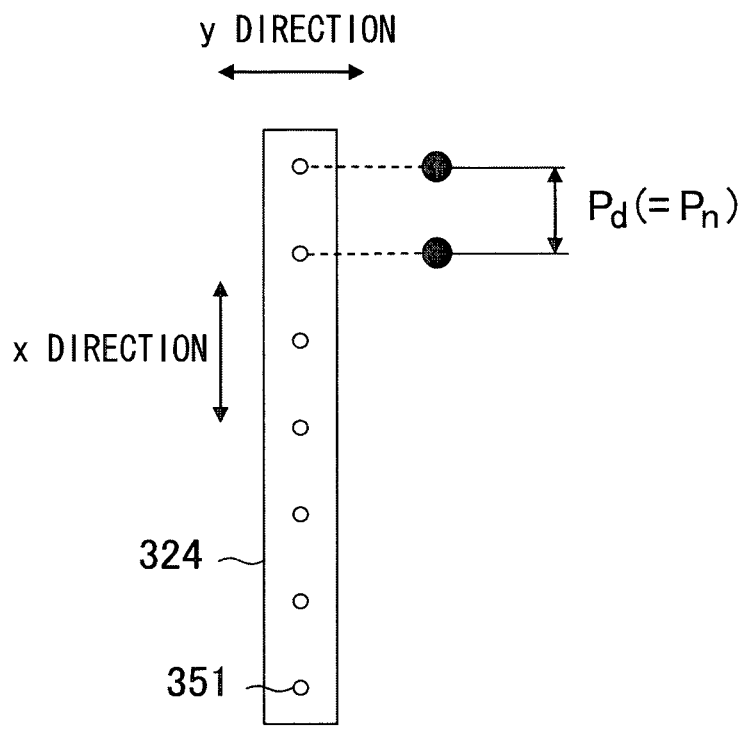
FIG. 12A is a diagram illustrating a head structure and control for changing a droplet deposition arrangement employed in a pattern transfer apparatus according to a second embodiment of the present invention.

A pattern transfer apparatus (resist application unit) according to a second embodiment of the present invention is described below. The pattern transfer apparatus in the second embodiment includes a head 324 shown in FIG. 12A, which has a single nozzle row (nozzle group) in which a plurality of nozzles 351 are aligned in the x direction. The arrangement pitch of the nozzles 351 in the head 324 shown in FIG. 12A is $P_n$ and the droplet deposition pitch $P_d$ in the x direction in this case is the same as the nozzle pitch $P_n$ in the x direction.

Figure 12B:
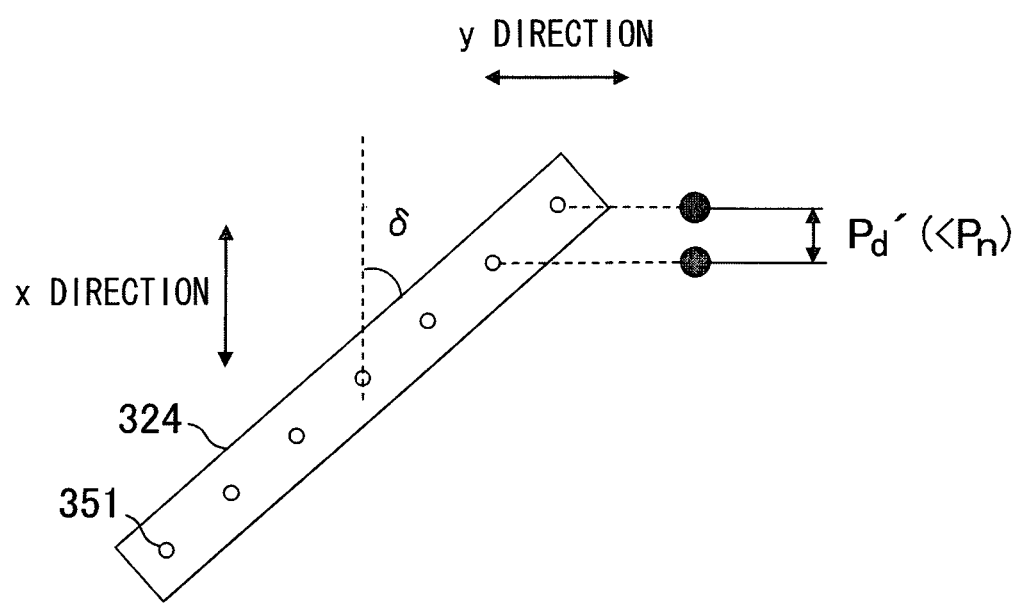
FIG. 12B is a diagram illustrating the head structure and control for changing a droplet deposition arrangement employed in the pattern transfer apparatus in the second embodiment.

The pattern transfer apparatus including the head 324 has a turning mechanism that turns the head 324 in an x-y plane, and as shown in FIG. 12B, the droplet deposition pitch in the x direction can be changed from $P_d$ to $P_d'$ ($<P_n$) by turning the head 324 in the x-y plane. When the turning angle of the head 324 is δ (where 0°<δ<90°), then $P_d'=P_n\times\cos δ$.

Figure 13:
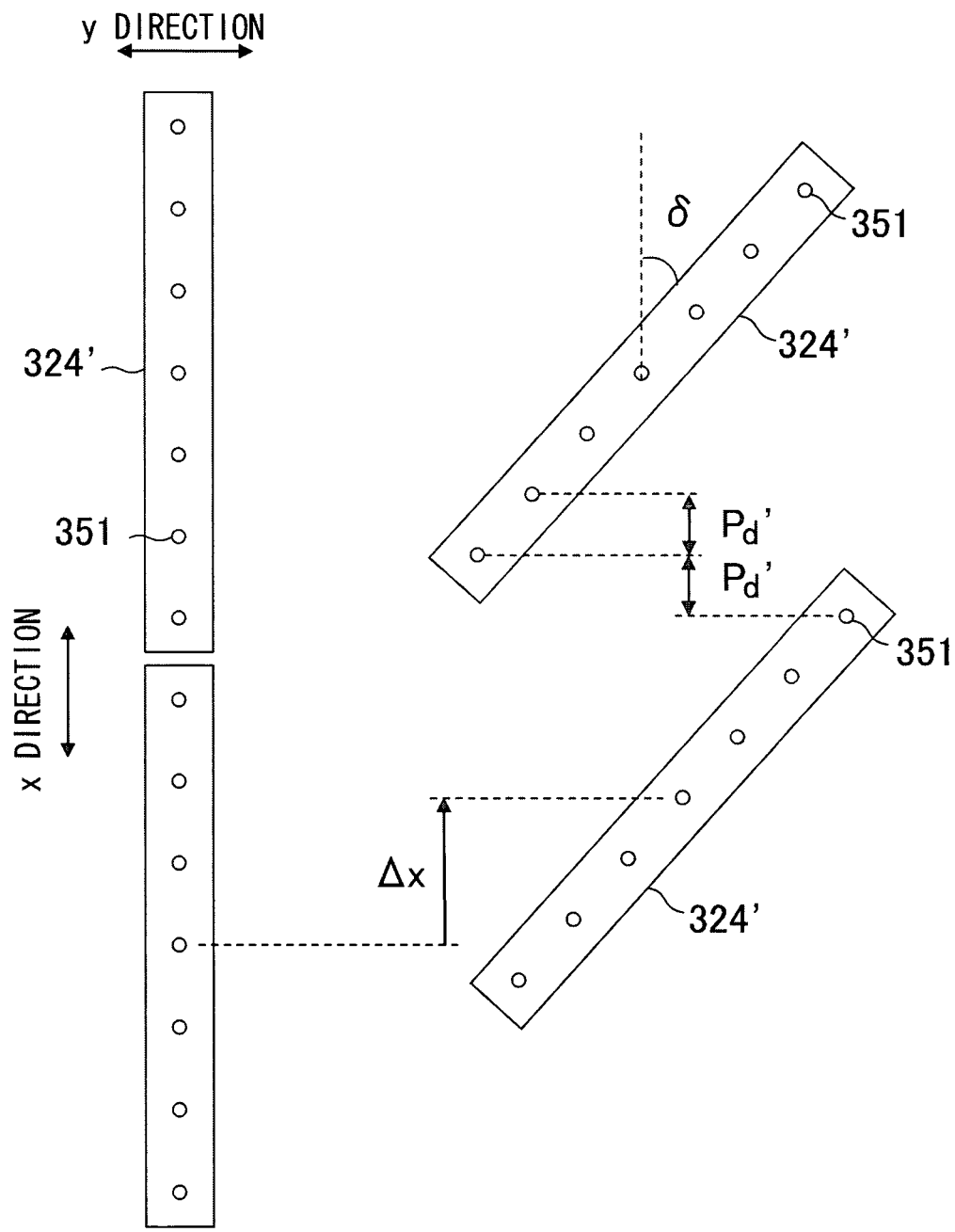
FIG. 13 is a diagram showing a modification of a head shown in FIGS. 12A and 12B.

FIG. 13 shows a schematic view of a mode where one long head is composed by joining together a plurality (e.g., two) of head modules 324', in the x direction. In this mode, the respective head modules 324' are turned and either of the head modules 324' should be moved by Δx in the x direction in such a manner that the droplet deposition pitch in the joint section of the head modules 324' is $P_d'$. Of course, it is possible to move both the head modules 324' in the x direction.

Thus, in the mode where the long head is composed by joining together the plurality of head modules 324' in the x direction, then in addition to providing the turning mechanism for turning each head module 324' in the x-y plane, an x direction movement mechanism is provided for altering the relative distance in the x direction between the adjacent head modules 324'.

The droplet deposition pitch in the y direction can be adjusted by changing the droplet ejection timing as described above. More specifically, due to the turn of the head modules 324', the droplet deposition positions in the y direction are displaced, and therefore the droplet ejection timing is changed for the nozzles which have displaced droplet deposition positions in the y direction as a result of the turn. Furthermore, the droplet ejection timing is changed if the y-direction droplet deposition pitch is changed.

According to the second embodiment, in the pattern transfer apparatus including the head 324 of the structure having the single nozzle group in which the nozzles 351 are aligned in the x direction, by making the head 324 capable of turning in the x-y plane, it is possible to change the droplet deposition pitch $P_d$ in the x direction from the nozzle pitch $P_n$ in the x direction to $P_n\times\cos δ$ (where 0°<δ<90°), and a desired application pattern of resist solution is achieved. Consequently, the applied amount of resist solution is optimized in accordance with the density of the resist solution droplets deposited onto the substrate.

Third Embodiment

A pattern transfer apparatus (resist application unit) according to a third embodiment of the present invention is described below. The pattern transfer apparatus in the third embodiment includes a serial type head which is shorter than the dimension (width) of the substrate in the x direction and performs droplet ejection in the x direction while scanning the substrate in the x direction.

Figure 14:
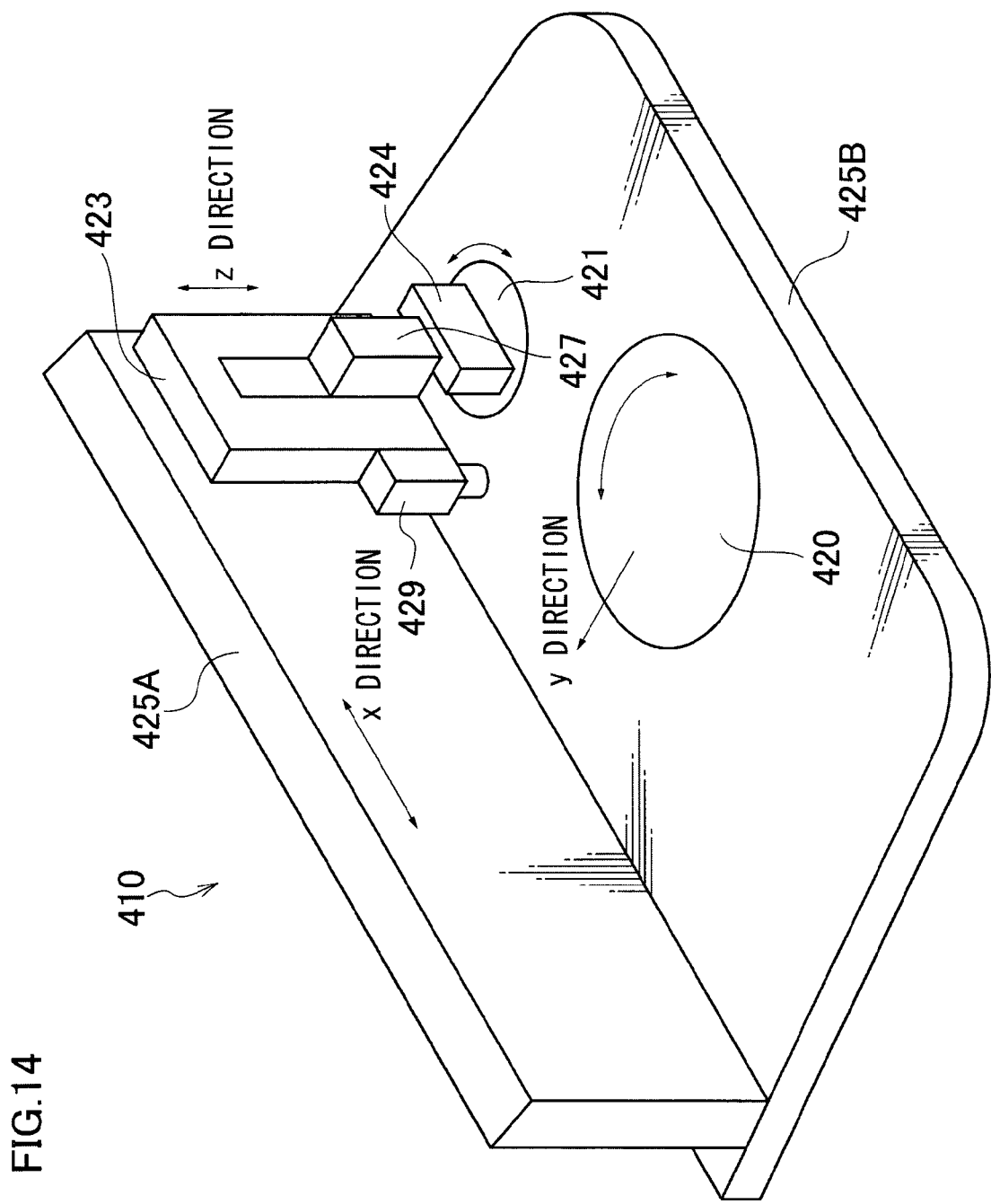
FIG. 14 is a perspective diagram showing the composition of a pattern transfer apparatus according to a third embodiment of the present invention.

FIG. 14 is a perspective diagram showing the overall composition of the pattern transfer apparatus 410 having a serial type head 424. The pattern transfer apparatus 410 shown in FIG. 14 includes: the head 424, which has one or more of nozzle groups in which a plurality of nozzles are aligned in the y direction; a carriage 423, which supports the head 424; an x direction movement mechanism 425A, which causes the head 424 supported on the carried 423 to perform scanning in the x direction; a y direction movement mechanism 425B, which moves a substrate 420 in a y direction; a head turning mechanism 421, which turns the head 424 within the x-y plane; a z direction movement mechanism 427, which moves the head 424 and the substrate 420 relatively in a z direction which is perpendicular to the x direction and the y direction; and a stopper 429, which restricts the position in the z direction of the head 424 in such a manner that the head 424 and the substrate 420 do not make contact with each other. The nozzle arrangement in the head 424 is the same as the head 324 shown in FIG. 11, and the x direction and the y direction are switched with respect to the situation shown in FIG. 11.

In the pattern transfer apparatus 410 shown in FIG. 14, the deposition operation of resist solution droplets in the x direction of the substrate 420 is performed while the head 424 is made to scan the substrate 420 in the x direction, and when one droplet deposition operation in the x direction has finished, the substrate 420 is moved by a prescribed amount in the y direction (the length in the y direction of the region on which the resist solution can be applied by one droplet deposition operation in the x direction), and droplet deposition in the x direction is performed in the next region. By repeating this process, the resist solution is applied to the whole surface of the substrate 420.

When the droplet deposition pitch in the y direction is changed, the head 424 is turned by a prescribed amount. It is also possible to provide a substrate turning mechanism, which turns the substrate 420 in the x-y plane, and to turn the substrate 420 instead of turning the head 424.

Figure 15:
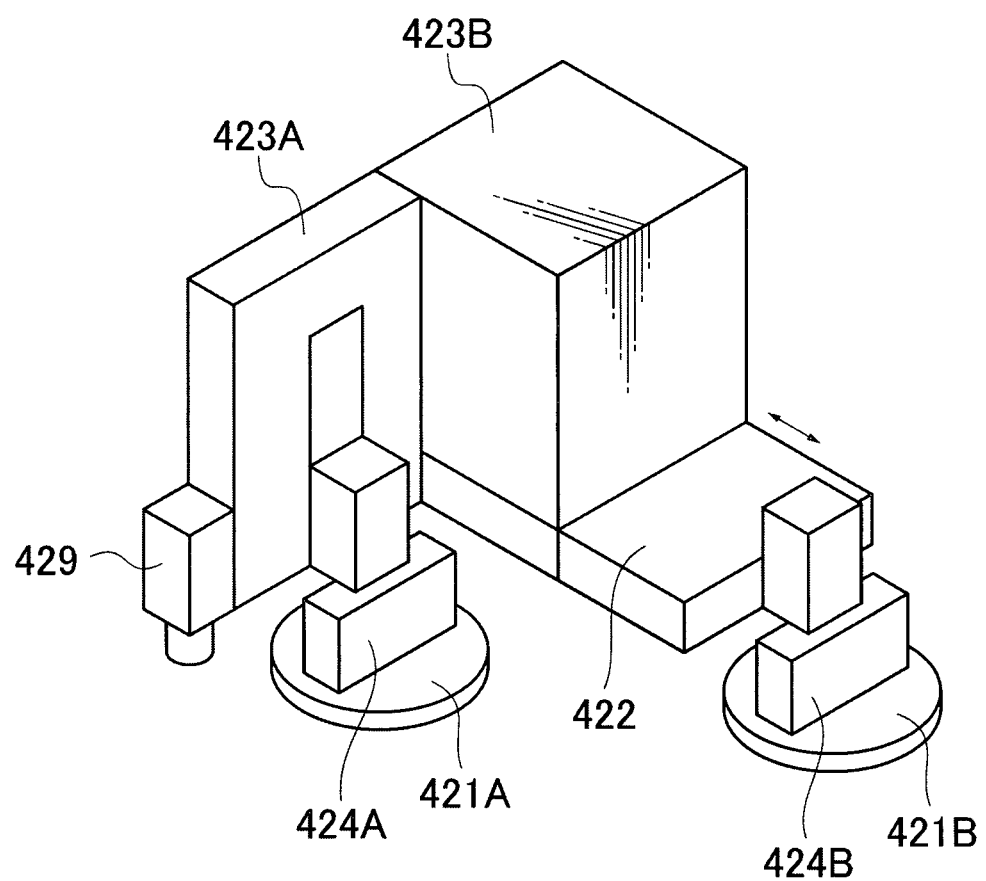
FIG. 15 is a diagram showing a modification of a head shown in FIG. 14.

FIG. 15 is a perspective diagram showing an extracted view of a head portion where two short heads 424A and 424B are arranged. This composition includes the composition having the second head 424B in addition to the composition in the FIG. 14. More specifically, the first head 424A is supported by a first carriage 423A, and can be turned in the x-y plane by a first head turning mechanism 421A. The second head 424B is supported by a second carriage 423B and is composed to be movable in the y direction by a y direction movement mechanism 422, and can be turned in the x-y plane by a second head turning mechanism 421B. The composition shown in FIG. 15 corresponds to the composition shown in FIG. 13, and the head module 324' on the upper side in FIG. 13 corresponds to the first head 424A and the head module 324' on the lower side in FIG. 13 corresponds to the second head 424B.

In the composition shown in FIGS. 14 and 15, it is possible to change the x-direction droplet deposition pitch by changing the droplet ejection timing. The drive signal generation unit 100 shown in FIG. 6 can be employed to change the droplet ejection timing. The drive signal generation unit 100 shown in FIG. 6 does not have to prepare a drive waveform for each separate nozzle, but rather needs to provide the common drive waveform for the whole head (for all of the head modules in a mode where the plurality of head modules are arranged), and therefore it is possible to make large savings in the memory space for storing the drive waveforms. On the other hand, with the drive signal generation unit 100 shown in FIG. 6, there are limits on shortening the period of the droplet ejection clock.

Therefore, if there are few nozzles as in the present embodiment, the speed of the ejection operation can be raised by preparing a drive waveform for each nozzle and appending delay data to the drive waveform of each nozzle.

Figure 16:
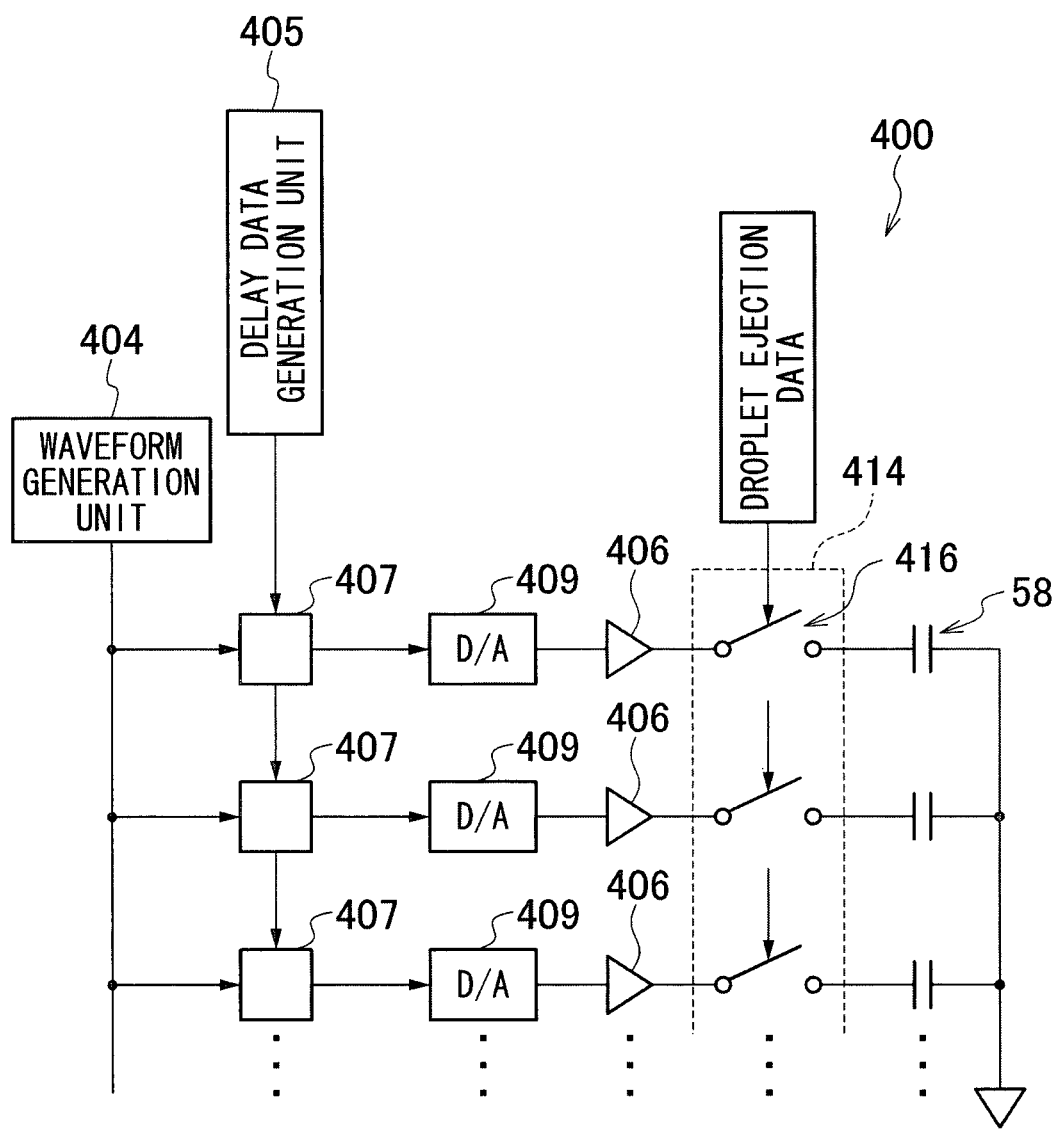
FIG. 16 is a block diagram showing the configuration of a drive signal generation unit employed in the pattern transfer apparatus in FIG. 14.

FIG. 16 is a block diagram showing the composition of a drive signal generation unit 400 designed to raise the speed of the ejection operation. The drive signal generation unit 400 shown in FIG. 16 includes: a waveform generation unit 404, which generates a drive waveform for each nozzle; a delay data generation unit 405, which calculates, for each nozzle, a delay time for use when changing the droplet deposition pitch in the x direction; an adder unit 407, which adds the delay time generated by the delay data generation unit 405, to the drive waveform data; a D/A converter 409, which converts drive waveform data in a digital format to an analogue format; and an amplifier unit 406, which performs voltage amplification processing and current amplification processing on the drive waveform in the analogue format.

When the piezoelectric elements 58 corresponding to the nozzles are operated by turning on and off switching elements 416 of a switching IC 414 on the basis of the droplet ejection data, droplets of resist solution are ejected from desired nozzles. Since this composition involves having the drive waveform and the delay time for each nozzle (each channel), then it is possible to shorten the droplet ejection period compared to the composition shown in FIG. 6.

Figure 17:
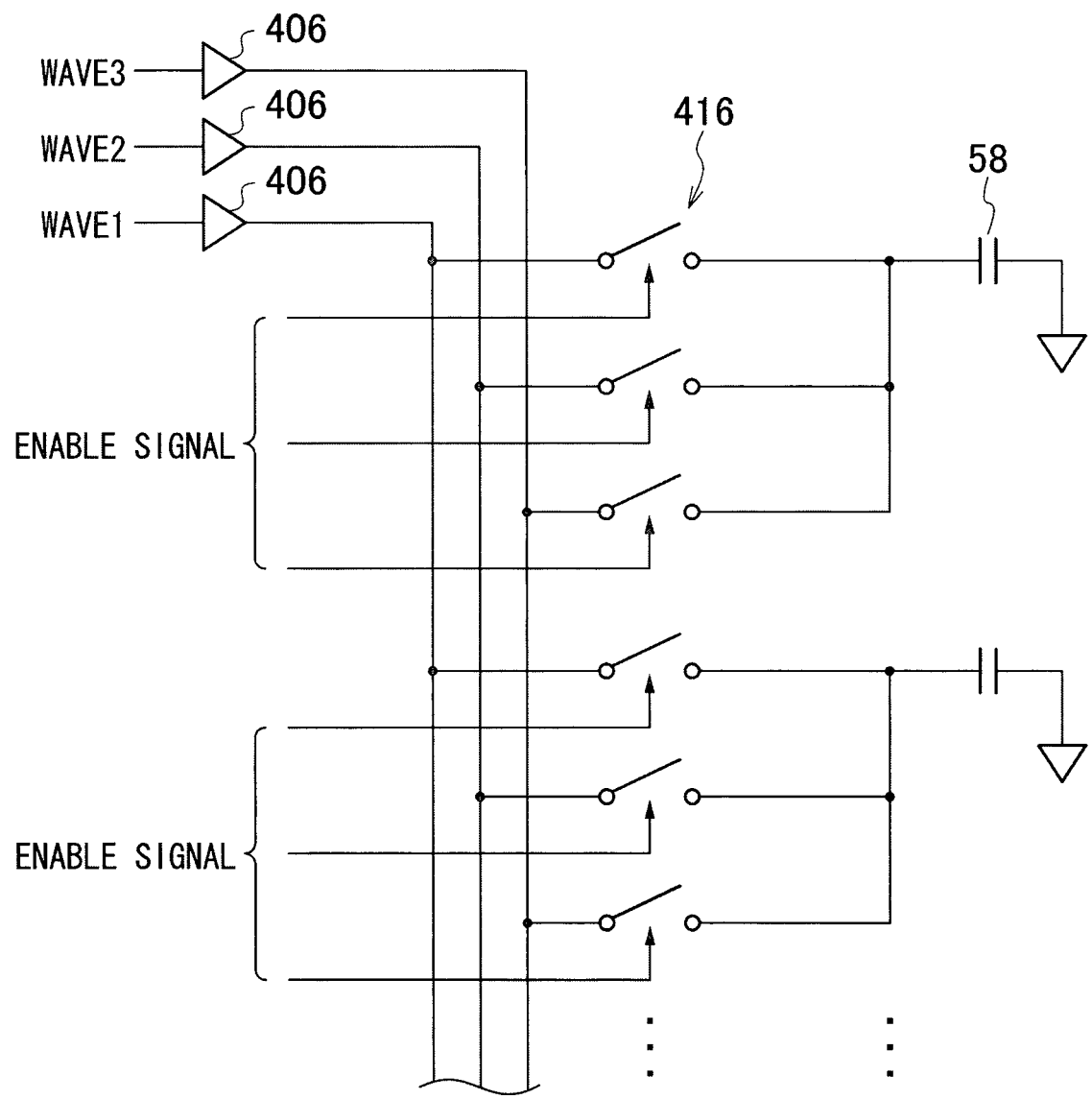
FIG. 17 is a block diagram showing a further mode of the drive signal generation unit shown in FIG. 16.

Furthermore, it is possible to adopt a composition in which a plurality of analogue waveforms (WAVE 1 to 3) are prepared as shown in FIG. 17, and one of the analogue waveforms is selected by an enable signal.

In the third embodiment having the composition as described above, only a portion of the nozzles aligned in the y direction are used and it is possible to switch the nozzles used with each scanning. The nozzles can be selected and switched by using nozzle switching in the control system described above. In this way, by using only a portion of the nozzles, from among the plurality of nozzles, and successively switching the nozzles used, it is possible to increase the lifespan of the head.

In the above-described embodiments of the present invention, the pattern transfer apparatuses for forming a pattern by resist solution are described; however, it is also possible to compose a liquid application apparatus according to an embodiment of the present invention which forms a prescribed pattern of resist solution on a substrate by arranging droplets of the resist solution discretely on the substrate by an inkjet method.

The pattern transfer apparatus, pattern transfer method and imprinting system according to the present invention have been described in detail above, but the present invention is not limited to the aforementioned examples, and it is of course possible for improvements or modifications of various kinds to be implemented, within a range which does not deviate from the essence of the present invention.

INDUSTRIAL APPLICABILITY

The present invention can be applied to a pattern transfer apparatus, a pattern transfer method and an imprinting system, and is especially suitable for nano-imprint lithography which forms a fine pattern in the sub-micron order.

REFERENCE SIGNS LIST

10, 410: pattern transfer apparatus; 12: resist application unit; 14: pattern transfer unit; 20: substrate; 22: conveyance unit; 24, 224, 324, 424: head; 26: stamper; 28: UV irradiation device; 51, 251: nozzle; 72: system controller; 80: droplet ejection controller; 100, 400: drive signal generation unit; 421: head turning mechanism; 422, 425B: y direction movement mechanism; 423: carriage; 425A: x direction movement mechanism; 427: z direction movement mechanism

The invention claimed is:

1. A liquid application apparatus, comprising:
a head including a plurality of nozzles which eject droplets of liquid having functional properties toward a substrate;
a relative movement device which causes the head and the substrate to move relatively to each other in a relative movement direction;
a droplet ejection control device which operates the head at a prescribed droplet ejection period so as to deposit the droplets discretely onto the substrate;
an x-direction droplet deposition pitch changing device which changes a deposition pitch of the droplets on the substrate in an x direction perpendicular to the relative movement direction; and
a y-direction droplet deposition pitch changing device which changes a deposition pitch of the droplets on the substrate in a y direction parallel to the relative movement direction, wherein:
the nozzles are arranged in one of a first matrix and a second matrix on the head, the first matrix comprises rows which are parallel to the x direction and columns which are oblique to the y direction, the second matrix comprises rows which are oblique to the x direction and columns which are oblique to the y direction and non-parallel to the rows, and the nozzles arranged in the one of the first matrix and the second matrix have a projected nozzle pitch which is a pitch of the nozzles assumed to be projected to align in the x direction;
the droplet ejection control device operates the head at a period of at least m times a minimum droplet ejection period so as to deposit the droplets discretely on the substrate, where m is an integer larger than 1;
the droplet ejection control device also serves as the x-direction droplet deposition pitch changing device that switches the nozzles to eject the droplets so as to change the deposition pitch of the droplets on the substrate in the x direction in units of n times the projected nozzle pitch, where n is a positive integer; and
the droplet ejection control device also serves as the y-direction droplet deposition pitch changing device that includes a delay time generation device which generates, with the minimum droplet ejection period as a minimum unit, a delay time of not shorter than the minimum droplet ejection period and not longer than (m−1) times the minimum droplet ejection period, and delays a drive timing of the head by using the delay time generated by the delay time generation device to change the deposition pitch of the droplets on the substrate in the y direction in units of the minimum droplet ejection period.

2. The liquid application apparatus as defined in claim 1, further comprising:
a plurality of supply flow channels which supply the liquid to liquid chambers connected respectively to the nozzles,
wherein the droplet ejection control device operates the head so as not to eject the droplets at a same droplet ejection timing from the nozzles connected to the liquid chambers to which a same one of the supply flow channels supplies the liquid.

3. The liquid application apparatus as defined in claim 1, wherein the droplet ejection control device operates the head so as not to eject the droplets at a same droplet ejection timing from the nozzles which are separated from each other by a minimum nozzle pitch in the x direction in the head.

4. The liquid application apparatus as defined in claim 1, wherein:
the droplet ejection control device operates the head at a period of at least m times a minimum droplet ejection period so as to deposit the droplets discretely on the substrate, where m is an integer larger than 1; and
the droplet ejection control device also serves as the x-direction droplet deposition pitch changing device that includes a delay time generation device which generates, with the minimum droplet ejection period as a minimum unit, a delay time of not shorter than the minimum droplet ejection period and not longer than (m−1) times the minimum droplet ejection period, and delays a drive timing of the head by using the delay time generated by the delay time generation device to change the deposition pitch of the droplets on the substrate in the x direction in units of the minimum droplet ejection period.

5. The liquid application apparatus as defined in claim 1, wherein the x-direction droplet deposition pitch changing device sets a standard deposition pitch of the droplets on the substrate in the x direction, to a periodic unit length of the one of the first matrix and the second matrix in the x direction.

6. The liquid application apparatus as defined in claim 2, wherein the liquid chambers connected to the nozzles arranged in each of the columns in the one of the first matrix and the second matrix are supplied with the liquid by a same one of the supply flow channels.

7. An imprinting system, comprising:
a head including a plurality of nozzles which eject droplets of liquid having functional properties toward a substrate;
a relative movement device which causes the head and the substrate to move relatively to each other in a relative movement direction;
a droplet ejection control device which operates the head at a prescribed droplet ejection period so as to deposit the droplets discretely onto the substrate;
an x-direction droplet deposition pitch changing device which changes a deposition pitch of the droplets on the substrate in an x direction perpendicular to the relative movement direction;
a y-direction droplet deposition pitch changing device which changes a deposition pitch of the droplets on the substrate in a y direction parallel to the relative movement direction;
a curing device which cures the liquid that has been applied to the substrate; and
a pattern transfer device which presses a die in which a projection-recess pattern is formed against the liquid that is during a course of curing by the curing device or has been cured by the curing device, thereby transferring the projection-recess pattern, wherein:

the nozzles are arranged in one of a first matrix and a second matrix on the head, the first matrix comprises rows which are parallel to the x direction and columns which are oblique to the y direction, the second matrix comprises rows which are oblique to the x direction and columns which are oblique to the y direction and non-parallel to the rows, and the nozzles arranged in the one of the first matrix and the second matrix have a projected nozzle pitch which is a pitch of the nozzles assumed to be projected to align in the x direction; and the droplet ejection control device operates the head at a period of at least m times a minimum droplet ejection period so as to deposit the droplets discretely on the substrate, where m is an integer larger than 1;

the droplet ejection control device also serves as the x-direction droplet deposition pitch changing device that switches the nozzles to eject the droplets so as to change the deposition pitch of the droplets on the substrate in the x direction in units of n times the projected nozzle pitch, where n is a positive integer; and the droplet ejection control device also serves as the y-direction droplet deposition pitch changing device that includes a delay time generation device which generates, with the minimum droplet ejection period as a minimum unit, a delay time of not shorter than the minimum droplet ejection period and not longer than (m−1) times the minimum droplet ejection period, and delays a drive timing of the head by using the delay time generated by the delay time generation device to change the deposition pitch of the droplets on the substrate in the y direction in units of the minimum droplet ejection period.

8. A liquid application apparatus, comprising:

a head including a plurality of nozzles which eject droplets of liquid having functional properties toward a substrate;

a relative movement device which causes the head and the substrate to move relatively to each other in a relative movement direction;

a droplet ejection control device which operates the head at a prescribed droplet ejection period so as to deposit the droplets discretely onto the substrate;

an x-direction droplet deposition pitch changing device which changes a deposition pitch of the droplets on the substrate in an x direction perpendicular to the relative movement direction; and a y-direction droplet deposition pitch changing device which charges a deposition pitch of the droplets on the substrate in a y direction parallel to the relative movement direction, wherein the nozzles are arranged in one of a first matrix and a second matrix on the head, the first matrix comprises rows which are parallel to the x direction and columns which are oblique to the y direction, the second matrix comprises rows which are oblique to the x direction and columns which are oblique to the y direction and non-parallel to the rows, and the nozzles arranged in the one of the first matrix and the second matrix have a projected nozzle pitch which is a pitch of the nozzles assumed to be projected to align in the x direction;

the droplet ejection control device also serves as the x-direction droplet deposition pitch changing device that switches the nozzles to eject the droplets so as to change the deposition pitch of the droplets on the substrate in the x direction in units of n times the projected nozzle pitch, where n is a positive integer;

the x-direction droplet deposition pitch changing device sets a standard deposition pitch of the droplets on the substrate in the x direction, to a periodic unit length of the one of the first matrix and the second matrix in the x direction; and when the x-direction droplet deposition pitch changing device changes the deposition pitch of the droplets on the substrate in the x direction to be shorter than the standard deposition pitch, the x-direction droplet deposition pitch changing device sets the deposition pitch of the droplets on the substrate in the x direction to be not shorter than two times the projected nozzle pitch.

9. An imprinting system, comprising:

a head including a plurality of nozzles which eject droplets of liquid having functional properties toward a substrate;

a relative movement device which causes the head and the substrate to move relatively to each other in a relative movement direction;

a droplet ejection control device which operates the head at a prescribed droplet ejection period so as to deposit the droplets discretely onto the substrate;

an x-direction droplet deposition pitch changing device which changes a deposition pitch of the droplets on the substrate in an x direction perpendicular to the relative movement direction;

a y-direction droplet deposition pitch changing device which changes a deposition pitch of the droplets on the substrate in a y direction parallel to the relative movement direction;

a curing device which cures the liquid that has been applied to the substrate; and a pattern transfer device which presses a die in which a projection-recess pattern is formed against the liquid that is during a course of curing by the curing device or has been cured by the curing device, thereby transferring the projection-recess pattern, wherein:

the nozzles are arranged in one of a first matrix and a second matrix on the head, the first matrix comprises rows which are parallel to the x direction and columns which are oblique to the y direction, the second matrix comprises rows which are oblique to the x direction and columns which are oblique to the y direction and non-parallel to the rows, and the nozzles arranged in the one of the first matrix and the second matrix have a projected nozzle pitch which is a pitch of the nozzles assumed to be projected to align in the x direction;

the droplet ejection control device also serves as the x-direction droplet deposition pitch changing device that switches the nozzles to eject the droplets so as to change the deposition pitch of the droplets on the substrate in the x direction in units of n times the projected nozzle pitch, where n is a positive integer;

the x-direction droplet deposition pitch changing device sets a standard deposition pitch of the droplets on the substrate in the x direction, to a periodic unit length of the one of the first matrix and the second matrix in the x direction; and when the x-direction droplet deposition pitch changing device changes the deposition pitch of the droplets on the substrate in the x direction to be shorter than the standard deposition pitch, the x-direction droplet deposition pitch changing device sets the deposition pitch of the droplets on the substrate in the x direction to be not shorter than two times the projected nozzle pitch.

* * * * *